(12) United States Patent
Novak

(10) Patent No.: US 6,727,774 B1
(45) Date of Patent: Apr. 27, 2004

(54) BYPASS CAPACITOR METHODS FOR ACHIEVING A DESIRED VALUE OF ELECTRICAL IMPEDANCE BETWEEN PARALLEL PLANAR CONDUCTORS OF AN ELECTRICAL POWER DISTRIBUTION STRUCTURE, AND ASSOCIATED ELECTRICAL POWER DISTRIBUTION STRUCTURES

(75) Inventor: Istvan Novak, Maynard, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/596,863

(22) Filed: Jun. 19, 2000

(51) Int. Cl.⁷ .............................. H01P 5/00; H01P 1/24
(52) U.S. Cl. ...................................... 333/12; 333/22 R
(58) Field of Search ................................. 333/12, 22 R

(56) References Cited

U.S. PATENT DOCUMENTS

| | | |
|---|---|---|
| 3,209,284 A | 9/1965 | Hast ..................... 333/22 R X |
| 3,678,417 A | 7/1972 | Ragan et al. ............. 333/22 R |
| 4,371,746 A | 2/1983 | Pepper, Jr. .................... 178/18 |
| 4,626,889 A | 12/1986 | Yamamoto et al. ... 333/22 R X |
| 5,114,912 A | 5/1992 | Benz ............................ 525/1 |
| 5,266,036 A | 11/1993 | Lichtenwalter et al. ........ 439/65 |
| 5,523,727 A | 6/1996 | Shingyoji ................. 333/22 R |
| 5,670,917 A | 9/1997 | Mazzochette ............. 333/22 R |
| 5,708,400 A | 1/1998 | Morris ........................ 333/12 |
| 5,818,315 A | 10/1998 | Moongilan ................ 333/2.38 |
| 6,104,258 A | 8/2000 | Novak ...................... 333/22 R |
| 6,198,362 B1 * | 3/2001 | Harada et al. ........ 333/22 R X |

OTHER PUBLICATIONS

Pannala et al., "Contribution of Resonance to Ground Bounce in Lossy Thin Film Planes," © 1998 IEEE, pp. 185–188.

Libous, "Characterization of Flip–Chip CMOS ASIC Simultaneous Switching Noise on Multilayer Organic and Ceramic BGA/CGA Packages," © 1998 IEEE, pp. 191–194.

Chen et al., "Norton Equivalent Modeling of Microprocessor Core Noise from Measurements," © 1998 IEEE, pp. 195–198.

Kim et al., "Rejection of SSN Coupling in Multilayer PCB using a Conductive Layer," 1998 pp. 199–202 IEEE.

(List continued on next page.)

*Primary Examiner*—Benny Lee

(57) ABSTRACT

Several methods are presented for achieving a desired value of electrical impedance between parallel planar conductors of an electrical power distribution structure by electrically coupling multiple bypass capacitors between the planar conductors. The methods include bypass capacitor selection criteria based upon simulation results. An exemplary electrical power distribution structure produced by one of the methods includes a pair of parallel planar conductors separated by a dielectric layer, and n discrete electrical capacitors electrically coupled between the planar conductors, where $n \geq 2$. The n capacitors have substantially the same capacitance C, mounted resistance $R_m$, and mounted inductance $L_m$. The electrical power distribution structure achieves an electrical impedance Z at a mounted resonant frequency $f_{m-res}$ of the capacitors. The mounted resistance $R_m$ of each of the n capacitors is substantially equal to $(n \cdot Z)$. The mounted inductance $L_m$ of each of the n capacitors is less than or equal to $(0.2 \cdot n \cdot \mu_0 \cdot h)$, where $\mu_0$ is the permeability of free space, and h is a distance between the planar conductors. The mounted resistance $R_m$ of each capacitor is the sum of an equivalent series resistance (ESR) of the capacitor and the electrical resistances of all conductors coupling the capacitor between the planar conductors. The mounted inductance $L_m$ of each capacitor is the electrical inductance resulting from the coupling of the capacitor between the planar conductors. The mounted resonant frequency $f_{m-res}$ results from capacitance C and mounted inductance $L_m$.

34 Claims, 19 Drawing Sheets

OTHER PUBLICATIONS

Becker et al., "Modeling, Simulation, and Measurement of Mid–Frequency Simultaneous Switching Noise in Computer Systems," IEEE Transactions on Components, Packaging, and Manufacturing Technology—Part B., vol. 21, No. 2, May 1998, pp. 157–163.

Huber et al., "Time–Domain Investigation of Decoupling Capacitors on MCM," May 1999, 2 pgs.

Madou et al., "Electrical Characterisation of Capacitors Integrated in Multi–layer Printed Circuit Boards," May 1999, 2 pgs.

Pham et al., "Decoupling Capacitors Techniques for High Frequency Board Designs," Feb. 1999, pp. 127–135.

Fisher et al., "The Role of Capacitors in High–Speed Systems Design," Feb. 1999, pp. 137–155. High Performances Design Conference.

Lipa et al., "Flip–Chip Power Distribution," © 1998 IEEE, pp. 39–41.

Wu et al., "Accurate Power Supply and Ground Plane Pair Models," © 1998 IEEE, pp. 163–166.

Moll et al., "Extraction of Equivalent Circuit Models of Package Power Supply Distribution Systems from Full Wave EM Field Simulations," © 1998 IEEE, pp. 167–170.

Fan et al., "Incorporating Vertical Discontinuities in Power–Bus Modeling using a Mixed–Potential Integral Equation and Circuit Extraction Formulation," © 1998 IEEE, pp. 171–174.

Zhao et al., "Effects of Power/Ground via Distribution on the Power/Ground Performance of C4/BGA Packages," © 1998 IEEE, pp. 177–180.

Novak, "Reducing Simultaneous Switching Noise and EMI on Ground/Power Planes by Dissipative Edge Termination," © 1998 IEEE, pp. 181–184.

Herrell et al., "Modeling of Power Distribution Systems in PCs," © 1998 IEEE, pp. 159–162.

Chen et al., "Modeling and Simulation of Thin–Film Decoupling Capacitors," © 1998 IEEE, pp. 205–208.

Diaz–Alvarez et al., "Power Decoupling with Integral Capacitors and Area Array Connections," © 1998 IEEE, pp. 209–212.

Roy et al., "ESR and ESL of Ceramic Capacitor Applied to Decoupling Applications," © 1998 IEEE, pp. 213–216.

Fang et al., "Modeling of the Electrical Performance of the Power and Ground Supply for a PC Microprocessor on a Card," © 1998 IEEE, pp. 116–119.

Shi et al., "An Experimental Procedure for Characterizing Interconnects to the DC Power Bus on a Multilayer Printed Circuit Board," IEEE Transactions on Electromagnetic Compatibility, vol. 39, No. 4, Nov. 1997, pp. 279–285.

Van den Berghe et al., "Study of the Ground Bounce caused by Power Plane Resonances," IEEE Transactions on Electromagnetic Compatibility, vol. 40, No. 2, May 1998, pp. 111–119.

Moran et al., "Application of the Finite–Difference Time–Domain Method and Measurement of Split Ground Plane Structures in Mixed Signal Integrated Circuits and Packages," May 1999, 2 pgs.

Lescot et al., "Effect of a Metallic Ground Plane on Advanced CMOS On–Chip Interconnects," May 1999, 2 pgs.

Novak, "Probes and Setup for Measuring Power–Plane Impedances with Vector Network Analyzer," Feb. 1999, pp. 201–214.

Daniele et al., "Spectral complete model for considering the effects of a finite ground plane on a PCB," 1996, pp. 226–229.

Leroux et al., "Modelling of Power Planes for Electrical Simulations," 1996, pp. 664–668.

Cai et al., "Numerical Extraction of Partial Inductance of Package Reference (Power/Ground) Planes," © 1995 IEEE, pp. 12–15.

Young, "Case Study of Ground Plane Inductance and Implications for Simulation,"," IEEE Transactions on Components, Packaging, and Manufacturing Technology—Part B., vol. 18, No. 1, Feb. 1995, pp. 174–178.

Peng, "Theory of Wave Guiding by Two–Dimensionally Periodic Structures: Progresses and Challenges," Aug. 1999, 1 pg.

Kelly et al., "Band Diagram for a Grounded Periodic Dielectric Substrate with Square Lattice and Finite Height," Aug. 1999, 1 pg.

Yang et al., "Fundamental Artificial–Periodic Substrate Effects on Printed Circuit Antennas," Aug. 1999, 1 pg.

Tzuang et al., "Guiding and Leaky Characteristics of Microstrip above Perforated Ground Plane," Aug. 1999, 1 pg.

Amari et al., "Simple Rules for Truncation of Periodic Structures to Achieve a Prescribed Bandcap Attenuation Level," Aug. 1999, 1 pg.

Patent Abstracts of Japan, publication No. 05335812, published Dec. 17, 1993.

Patent Abstracts of Japan, publication No. 05055813, published Mar. 5, 1993.

Patent Abstracts of Japan, publication No. 05145306, published Jun. 11, 1993.

Abstract for SU 433 898, published Oct. 30, 1982.

Lei et al., "Power Distribution Noise Suppression Using Transmission Line Termination Techniques," © 1996 IEEE, pp. 100–102.

O'Sullivan et al., "Developing a Decoupling Methodology with SPICE for Multilayer Printed Circuit Boards," © 1998 IEEE, pp. 652–655.

Bandyopadhyay et al., "Importance of Damping and Resonance in Thin–Film Integrated Decoupling Capacitor Design," © 1997 IEEE, pp. 31–34.

Fang et al., "Effects of Losses in Power and Ground Planes in the Simulation of Simultaneous Switching Noise," Proceedings of the 3rd Topical Meeting on Electrical Performance of Electronic Packaging, 1994 pp. 110–112.

Franz et al., "An Approach to Determine Decoupling Effects of VCC and VCG Structures in Multilayer Technique," Proceedings of the 1994 EMC Symposium, May 1994, pp. 56–59.

Ramo et al., *Fields and Waves in Communication Electronics*, Third Edition, John Wiley & Sons, Inc., 1994, Chapter 9, pp. 464–467.

Lee et al., "Modeling and Analysis of Multichip Module Power Supply Planes," IEEE Transactions on Components, Packaging, and Manufacturing Technology—Part B, vol. 18, No. 4, Nov. 1995, pp. 628–639.

* cited by examiner

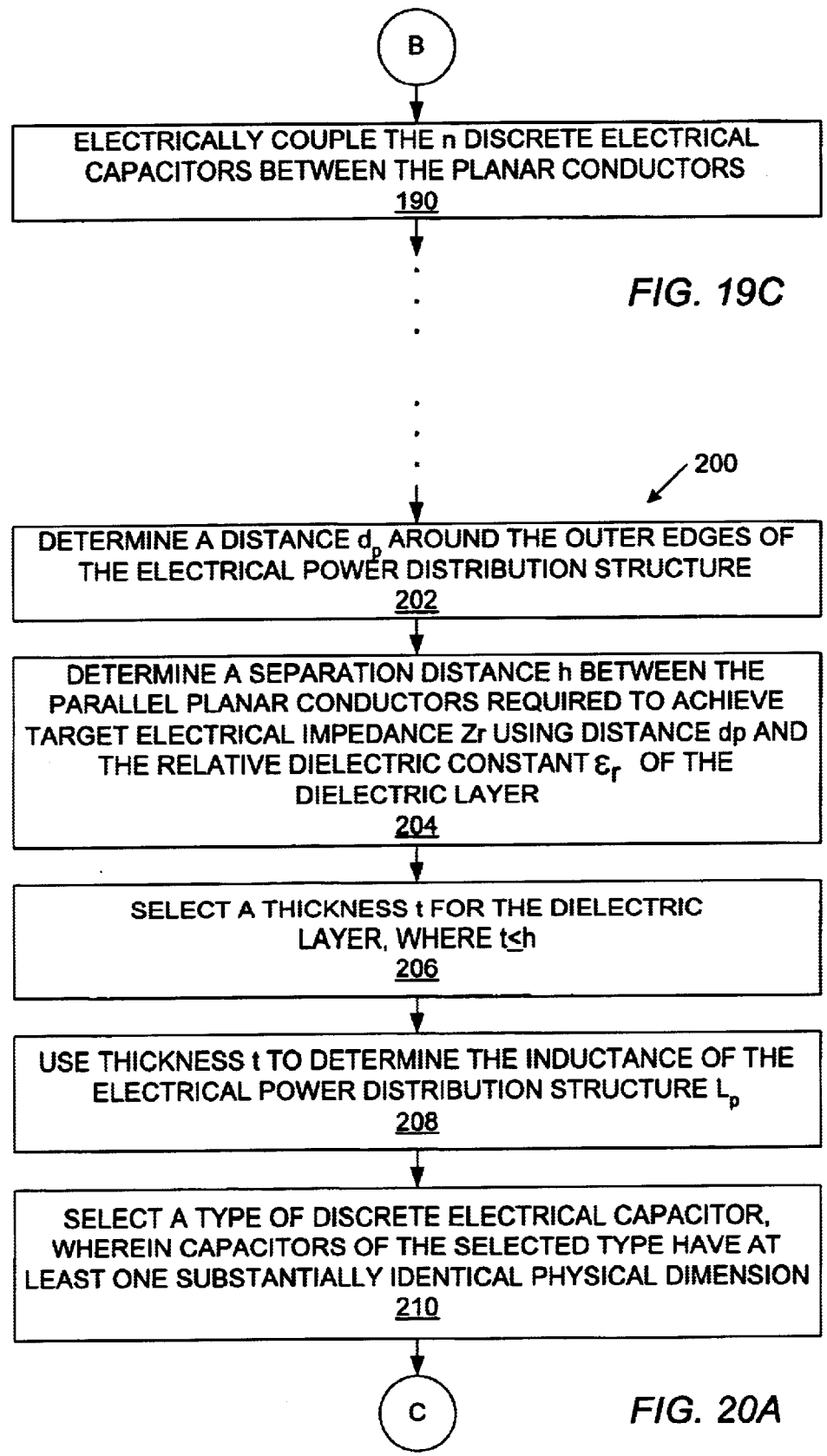

BYPASS CAPACITOR METHODS FOR ACHIEVING A DESIRED VALUE OF ELECTRICAL IMPEDANCE BETWEEN PARALLEL PLANAR CONDUCTORS OF AN ELECTRICAL POWER DISTRIBUTION STRUCTURE, AND ASSOCIATED ELECTRICAL POWER DISTRIBUTION STRUCTURES

BACKGROUND OF THE INVENTION

1. Field of the Invention

This invention relates to electronic systems, and more particularly to electrical interconnecting apparatus having continuous planar conductors (e.g., power planes).

2. Description of the Related Art

A power distribution network of a typical printed circuit board (PCB) includes several capacitors coupled between conductors used to convey direct current (d.c.) electrical power voltages and ground conductors. For example, the power distribution network of a digital PCB typically includes a bulk decoupling or "power entry" capacitor located at a point where electrical power enters the PCB from an external power supply. The power distribution network also typically includes a decoupling capacitor positioned w near each of several digital switching circuits (e.g., digital integrated circuits coupled to the PCB). The digital switching circuits dissipate electrical power during switching times (e.g., clock pulse transitions). Each decoupling capacitor typically has a capacitance sufficient to supply electrical current to the corresponding switching circuit during switching times such that the d.c. electrical voltage supplied to the switching circuit remains substantially constant. The power entry capacitor may, for example, have a capacitance greater than or equal to the sum of the capacitances of the decoupling capacitors.

In addition to supplying electrical current to the corresponding switching circuits during switching times, decoupling capacitors also provide low impedance paths to the ground electrical potential for alternating current (a.c.) voltages. Decoupling capacitors thus shunt or "bypass" unwanted a.c. voltages present on d.c. power trace conductors to the ground electrical potential. For this reason, the terms "decoupling capacitor" and "bypass capacitor" are often used synonymously.

As used herein, the term "bypass capacitor" is used to describe any capacitor coupled between a d.c. voltage conductor and a ground conductor, thus providing a low impedance path to the ground electrical potential for a.c. voltages.

A typical bypass capacitor is a two-terminal electrical component. FIG. 1 is a diagram of an electrical model 10 of a capacitor (e.g., a bypass capacitor) valid over a range of frequencies including a resonant frequency $f_{res}$ of the capacitor. Electrical model 10 includes an ideal capacitor, an ideal resistor, and an ideal inductor in series between the two terminals of the capacitor. The ideal capacitor has a value C equal to a capacitance of the capacitor. The ideal resistor has a value equal to an equivalent series resistance (ESR) of the capacitor, and the ideal inductor has a value equal to an equivalent series inductance (ESL) of the capacitor. The series combination of the capacitance (C) and the inductance (ESL) of the capacitor results in series resonance and a resonant frequency $f_{res}$ given by:

$$f_{res} = \frac{1}{2\pi\sqrt{(ESL)(C)}}.$$

FIG. 2 is a graph of the logarithm of the magnitude of the electrical impedance (Z) between the terminals of electrical model 10 versus the logarithm of frequency $f$. At frequencies $f$ lower than resonant frequency $f_{res}$, the impedance of electrical model 10 is dominated by the capacitance, and the magnitude of Z decreases with increasing frequency $f$. At the resonant frequency $f_{res}$ of the capacitor, the magnitude of Z is a minimum and equal to the ESR of the capacitor. Within a range of frequencies centered about resonant frequency $f_{res}$, the impedance of electrical model 10 is dominated by the resistance, and the magnitude of Z is substantially equal to the ESR of the capacitor. At frequencies $f$ greater than resonant frequency $f_{res}$, the impedance of electrical model 10 is dominated by the inductance, and the magnitude of Z increases with increasing frequency $f$. When a desired electrical impedance between a d.c. voltage conductor and a ground conductor is less than the ESR of a single capacitor, it is common to couple more than one of the capacitors in parallel between the d.c. voltage conductor and the ground conductor. In this case, all of the capacitors have substantially the same resonant frequency $f_{res}$, and the desired electrical impedance is achieved over a range of frequencies including the resonant frequency $f_{res}$.

When the desired electrical impedance is to be achieved over a range of frequencies broader than a single capacitor can provide, it is common to couple multiple capacitors having different resonant frequencies between the d.c. voltage conductor and the ground conductor. The ESRs and resonant frequencies of the capacitors are selected such that each of the capacitors achieves the desired electrical impedance over a different portion of the range of frequencies. In parallel combination, the multiple capacitors achieve the desired electrical impedance over the entire range of frequencies.

A digital signal alternating between high and low voltage levels includes contributions from a fundamental sinusoidal frequency (i.e., a first harmonic) and integer multiples of the first harmonic. As the rise and fall times of a digital signal c, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of electrical inductance. The voltage across the inductance of a conductor is directly proportional to the rate of change of current through the conductor. At the high frequencies present in conductors carrying digital signals having short transition times, a significant voltage drop occurs across a conductor having even a small inductance. Transient switching currents flowing through electrical impedances of d.c. power conductors cause power supply voltage perturbations (e.g., power supply "droop" and ground "bounce"). As signal frequencies increase, continuous power supply planes (e.g., power planes and ground planes) having relatively low electrical inductances are being used more and more. The parallel power and ground planes are commonly placed in close proximity to one another in order to further reduce the inductances of the planes.

The magnitude of electrical impedance between two parallel conductive planes (e.g., adjacent power and ground planes) may vary widely within the frequency ranges of electronic systems with digital signals having short transition times. The parallel conductive planes may exhibit multiple electrical resonances, resulting in alternating high and low impedance values. High impedance values between power and ground planes are undesirable as transient switching currents flowing through the high electrical impedances cause relatively large power supply voltage perturbations.

It would thus be desirable to have a bypass capacitor method for achieving a desired value of electrical impedance between parallel conductive planes of an electrical power distribution structure, wherein variations in the electrical impedance are relatively small over a wide range of frequencies. It would also be advantageous if the desired method would provide for optional suppression of the electrical resonances of the planes in addition to achieving the desired value of electrical impedance over a wide range of frequencies. Magnitudes of power supply voltage perturbations resulting from transient switching currents would be significantly reduced in electrical power distribution structures resulting from applications of the above methods.

SUMMARY OF THE INVENTION

Several methods are presented for achieving a desired value of electrical impedance between parallel planar conductors of an electrical power distribution structure by electrically coupling multiple bypass capacitors between the planar conductors. The methods include bypass capacitor selection criteria based upon simulation results. An exemplary electrical power distribution structure produced by one of the methods includes a pair of parallel planar conductors separated by a dielectric layer, and n discrete electrical capacitors electrically coupled between the planar conductors, where $n \geq 2$. The n capacitors have substantially the same capacitance C, mounted resistance $R_m$, mounted inductance $L_m$, and mounted resonant frequency $f_{m-res}$. The electrical power distribution structure achieves an electrical impedance Z at the resonant frequency $f_{m-res}$ of the capacitors. In order to achieve the desired value of electrical impedance, the mounted resistance $R_m$ of each of the n capacitors is substantially equal to (n·Z). In order to reduce variations in the electrical impedance with frequency, the mounted inductance $L_m$ of each of the n capacitors is less than or equal to $(0.2 \cdot n \cdot \mu_0 \cdot h)$, where $\mu_0$ is the permeability of free space, and h is a distance between the planar conductors. It is noted that dielectric materials used to form dielectric layers are typically non-magnetic, and thus the relative permeability $\mu_r$ of the dielectric layer is assumed to be unity.

The mounted resistance $R_m$ of each of the n capacitors is the sum of an equivalent series resistance (ESR) of the capacitor and the electrical resistances of all conductors coupling the capacitor between the planar conductors. The mounted inductance $L_m$ of each of the n capacitors is the electrical inductance resulting from the coupling of the capacitor between the planar conductors. For example, each of the n capacitors may have a body. In this case, the mounted resistance $R_m$ of each of the n capacitors is the sum of the ESR of the capacitor body and the electrical resistances of all conductors (e.g., solder lands and vias) coupling the capacitor body between the planar conductors. Similarly, the mounted inductance $L_m$ of each of the n capacitors is the electrical inductance resulting from the coupling of the capacitor body between the planar conductors. The mounted resonant frequency $f_{m-res}$ resulting from capacitance C and mounted inductance $L_m$ is given by:

$$f_{m-res} = \frac{1}{2\pi \sqrt{(L_m)(C)}}.$$

The n discrete capacitors may or may not be used to suppress electrical resonances between the planar conductors. Where the n discrete capacitors are not used to suppress the electrical resonances, the n discrete capacitors may be located upon, and distributed about, one or more surfaces of the planar conductors. On the other hand, when the n discrete capacitors are used to suppress the electrical resonances, the n discrete capacitors may be positioned along at least a portion of corresponding outer edges of the planar conductors. In this case, adjacent capacitors may be separated by substantially equal spacing distances.

A first method for achieving a target electrical impedance $Z_t$ in an electrical power distribution structure including a pair of parallel planar conductors separated by a dielectric layer may be useful where bypass capacitors will not be used to suppress plane resonances. In this case, the bypass capacitors maybe distributed about a surface of at least one of the planar conductors. The first method includes determining a required number n of a selected type of discrete electrical capacitor dependent upon an inductance of the electrical power distribution structure $L_p$ and a mounted inductance $L_m$ of a representative one of the selected type of discrete electrical capacitor when electrically coupled between the planar conductors, wherein $n \geq 2$. The required number n of the selected type of capacitor may be determined using:

$$n = \frac{L_m}{(0.2 \cdot L_p)}.$$

The target electrical impedance $Z_t$ is used to determine a required value of mounted resistance $R_{m-req}$ for the n discrete electrical capacitors. The required value of mounted resistance $R_{m-req}$ may be determined using:

$$R_{m-req} = n \cdot Z_t.$$

The required number n of the selected type of discrete electrical capacitor are selected, wherein each of the n capacitors has a mounted resistance $R_m$ substantially equal to the value of required mounted resistance $R_{m-req}$. The mounted resistance $R_m$ of each of the n capacitors may be the sum of an equivalent series resistance (ESR) of the capacitor and the electrical resistances of all conductors coupling the capacitor between the planar conductors. The n discrete electrical capacitors are electrically coupled between the planar conductors.

The first method may also include determining a separation distance h between the parallel planar conductors required to achieve the target electrical impedance $Z_t$. The separation distance h may be determined using:

$$h = \frac{(Z_t)(\sqrt{\varepsilon_r})(d_p)}{(0.523)}$$

where $\varepsilon_r$ is the relative permittivity of the dielectric layer and $d_p$ is a distance around an outer perimeter of the electrical power distribution structure. Separation distance h is in mils when the target electrical impedance $Z_t$ is in ohms and distance $d_p$ is in inches.

A thickness t for the dielectric layer may be selected such that the thickness t is less than or equal to the required separation distance h. Thickness t may be used to determine the inductance of the electrical power distribution structure $L_p$. The inductance of the electrical power distribution structure $L_p$ may be determined using:

$$L_p = (\mu_0 \cdot t)$$

wherein $\mu_0$ is the permeability of free space.

The type of discrete electrical capacitor may be selected, wherein capacitors of the selected type have at least one substantially identical physical dimension (e.g., a length of the capacitor package between terminals) upon which the mounted inductance of the capacitors is dependent. The physical dimension may be used to determine the mounted inductance $L_m$ of the representative capacitor.

A second method for achieving a target electrical impedance $Z_t$ in an electrical power distribution structure including a pair of parallel planar conductors separated by a dielectric layer may be useful where the bypass capacitors will be used to suppress plane resonances. In this case, at least a portion of the bypass capacitors will be electrically coupled between the planar conductors along an outer edge of the planar conductors. The second method includes determining a first required number $n_1$ of discrete electrical capacitors dependent upon an inductance of the electrical power distribution structure $L_p$ and a mounted inductance $L_m$ of each of the discrete electrical capacitors when electrically coupled between the planar conductors, where $n_1 \geq 2$. The first required number $n_1$ of the discrete electrical capacitors may be determined using:

$$n_1 = \frac{L_m}{(0.2 \cdot L_p)}.$$

A second required number $n_2$ of the discrete electrical capacitors is determined dependent upon a distance $d_p$ around an outer perimeter of the electrical power distribution structure (i.e., the parallel planar conductors) and a spacing distance S between adjacent discrete electrical capacitors, where $n_2 \geq 2$. The second required number $n_2$ of the discrete electrical capacitors may be determined using:

$$n_2 = \frac{d_p}{S}.$$

Spacing distance S may be less than or equal to a maximum spacing distance $S_{max}$ between adjacent electrical capacitors. The electrical power distribution structure may be, for example, part of an electrical interconnecting apparatus, and electrical signals may be conveyed within the electrical interconnecting apparatus. The electrical signals may have an associated frequency range, and maximum spacing distance $S_{max}$ be a fraction of a wavelength of a maximum frequency $f_{max}$ of the frequency range of the electrical signals. Maximum spacing distance $S_{max}$ may be given by:

$$S_{max} = 0.1 \cdot \frac{c}{(\sqrt{\varepsilon_r} \cdot f_{max})}$$

wherein c is the speed of light in a vacuum, $\varepsilon_r$ is the relative permittivity (i.e., the dielectric constant) of the dielectric layer, and $f_{max}$ is the maximum frequency of the frequency range of the electrical signals.

If $n_2 \geq n_1$, the following steps are performed. A required value of mounted resistance $R_{m-req}$ is determined for $n_2$ of the discrete electrical capacitors dependent upon the target electrical impedance $Z_t$. The required value of mounted resistance $R_{m-req}$ for the $n_2$ capacitors may be determined using:

$$R_{m-req} = n_2 \cdot Z_t.$$

The number $n_2$ of the discrete electrical capacitors are selected, wherein each of the $n_2$ capacitors has a mounted resistance $R_m$ substantially equal to the value of required mounted resistance $R_{m-req}$. The mounted resistance $R_m$ of a given capacitor may be the sum of an ESR of the capacitor and the electrical resistances of all conductors coupling the capacitor between the planar conductors. The $n_2$ discrete electrical capacitors are electrically coupled between the planar conductors along the outer perimeter of the parallel planar conductors.

The second method may also include the determining of a separation distance h between the parallel planar conductors required to achieve the target electrical impedance $Z_t$ as described above. A thickness t for the dielectric layer may be selected such that the thickness t is less than or equal to the required separation distance h. Thickness t may be used to determine the inductance of the electrical power distribution structure $L_p$ as described above.

The type of discrete electrical capacitor may be selected, wherein capacitors of the selected type have at least one substantially identical physical dimension (e.g., a length of the capacitor package between terminals) upon which the mounted inductance of the capacitors is dependent. The physical dimension may be used to determine the mounted inductance $L_m$ of the representative capacitor.

If $n_1 > n_2$, the following steps may be performed. The target electrical impedance $Z_t$ may be used to determine a required value of mounted resistance $R_{m-req}$ for $n_1$ of the discrete electrical capacitors. The required value of mounted resistance $R_{m-req}$ for the $n_1$ capacitors may be determined using:

$$R_{m-req} = n_1 \cdot Z_t.$$

The number $n_1$ of the discrete electrical capacitors may be selected, wherein each of the $n_1$ capacitors has a mounted resistance $R_m$ substantially equal to the value of required mounted resistance $R_{m-req}$. The $n_1$ discrete electrical capacitors may be electrically between the planar conductors such that: (i) $n_2$ of the discrete electrical capacitors are positioned along the outer perimeter of the planar conductors, and (ii) the remaining ($n_1-n_2$) capacitors are dispersed across a surface of at least one of the planar conductors.

Regarding distance $d_p$ around the outer edges (i.e., the outer perimeter) of the electrical power distribution structure, the electrical power distribution structure may have, for example, four sides arranged as two pairs of opposite sides. The sides forming one of the pairs of opposite sides may have equal lengths x, and the other two opposite sides may have equal lengths y. In this case, the distance $d_p$ around the outer perimeter of the electrical power distribution structure is equal to $2 \cdot (x+y)$.

BRIEF DESCRIPTION OF THE DRAWINGS

Other objects and advantages of the invention will become apparent upon reading the following detailed description and upon reference to the accompanying drawings in which:

FIGS. 19A, 19B, and 19C in combination form a flow chart of one embodiment of a first method for achieving a target electrical impedance $Z_t$ in an electrical power distribution structure including a pair of parallel planar conductors separated by a dielectric layer; and FIGS. 20A, 20B, 20C, and 20D in combination form a flow chart of one embodiment of a second method for achieving a target electrical impedance $Z_t$ in an electrical power distribution structure including a pair of parallel planar conductors separated by a dielectric layer.

Figure 1:
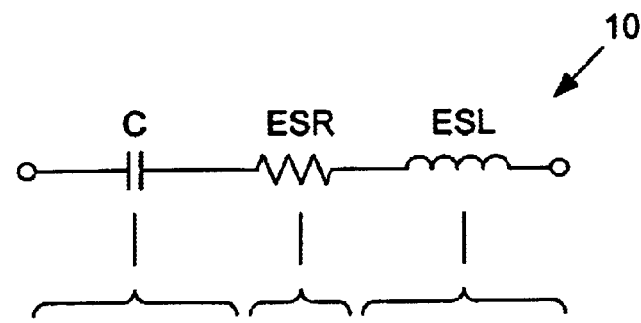
FIG. 1 is a diagram of an electrical model of a capacitor (e.g., a bypass capacitor) valid over a range of frequencies including a resonant frequency $f_{res}$ of the capacitor, wherein the electrical model includes an ideal capacitor, an ideal resistor, and an ideal inductor in series between two terminals of the capacitor, and wherein the ideal capacitor has a value C equal to a capacitance of the capacitor, and wherein the ideal resistor has a value equal to an equivalent series resistance (ESR) of the capacitor, and wherein the ideal inductor has a value equal to an equivalent series inductance (ESL) of the capacitor.
Figure 2:
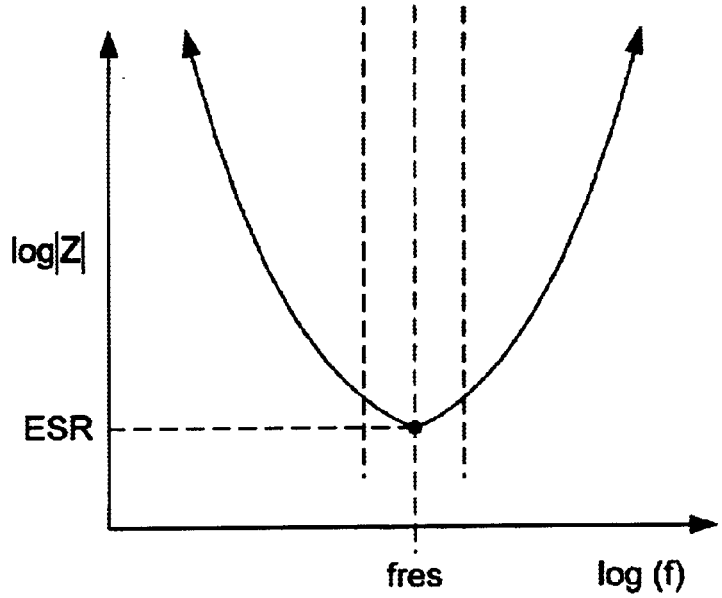
FIG. 2 is a graph of the logarithm of the magnitude of the electrical impedance (Z) between the terminals of the electrical model of FIG. 1 versus the logarithm of frequency $f$.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
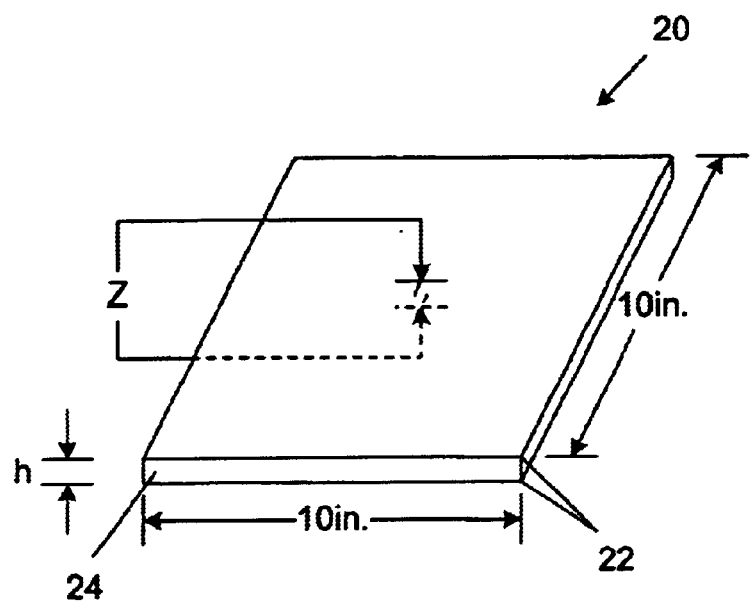
FIG. 3 is a perspective view of a structure including a pair of 10 in.×10 in. square conductive planes separated by a dielectric layer having a dimension or height h between the conductive planes.

FIG. 3 is a perspective view of a structure 20 including a pair of 10 in.×10 in. square conductive planes 22 separated by a fiberglass-epoxy composite dielectric layer 24 having a height h. Each conductive plane 22 is made of copper and is about 0.0014 in. thick. Dielectric layer 24 is made of FR4 dielectric material having a dielectric constant of about 4.0, and height h is approximately 0.002 in.

Figure 4:
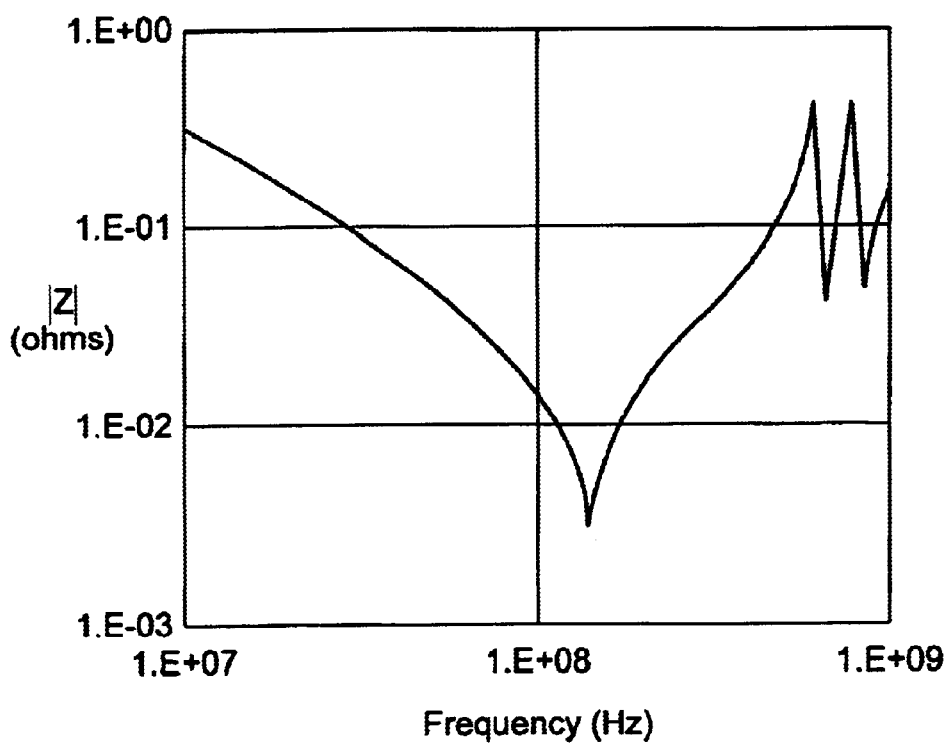
FIG. 4 is a graph of the simulated magnitude of electrical impedance (Z) of the structure of FIG. 3 between the pair of rectangular conductive planes versus frequency.

FIG. 4 is a graph of the simulated magnitude of electrical impedance (Z) of structure 20 of FIG. 3 between the pair of rectangular conductive planes 22 versus frequency. The graph was created by modeling each half-inch square of the pair of conductive planes 22 as a matrix of transmission lines. The impedance value was ID computed by simulating the application of a 1 ampere constant current between the centers of planes 22, varying the frequency of the current, and determining the magnitude of the steady state voltage between the centers of planes 22.

As shown in FIG. 4, the magnitude of the electrical impedance between conductive planes 22 of FIG. 3 varies widely at frequencies above about 500 MH. Conductive planes 22 exhibit multiple electrical resonances at frequencies between about 150 and 1 GHz, resulting in alternating high and low impedance values. Conductive planes 22 would be poor candidates for power and ground planes of an electrical interconnecting apparatus (e.g., a PCB) conveying signals having significant frequency content above 500 MHz as the high impedance values of conductive planes 22 at frequencies above 500 MHz would cause relatively large power supply voltage perturbations.

Figure 5:
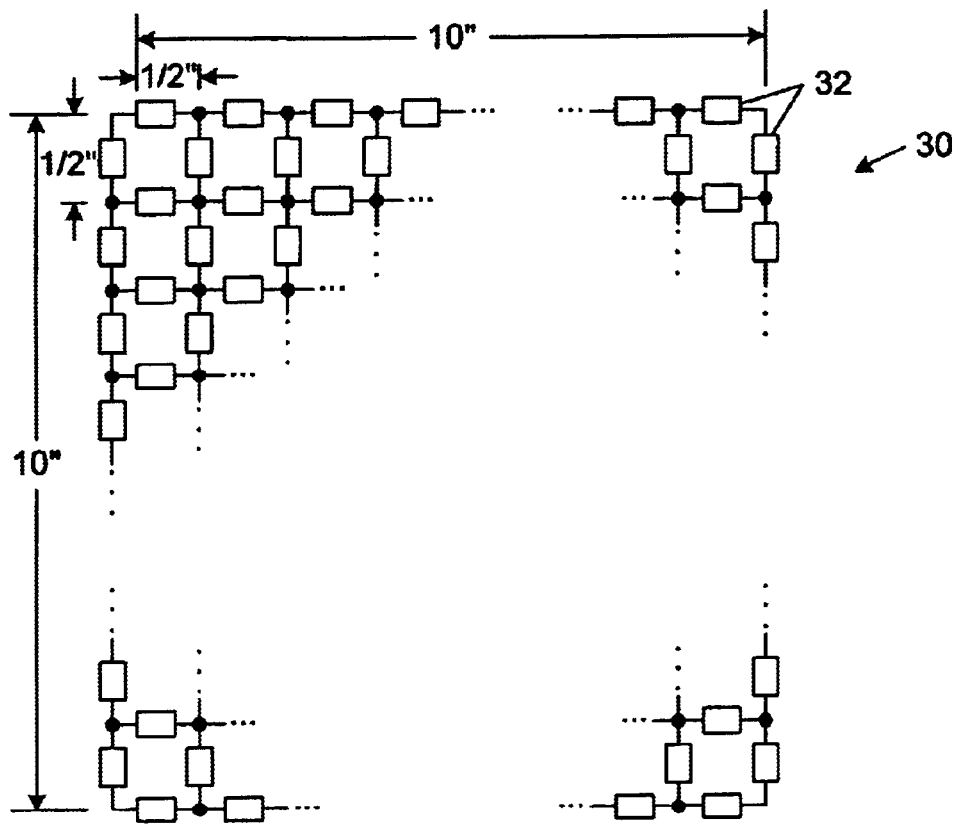
FIG. 5 is a top plan view of a model used to model the structure of FIG. 3, wherein the model is a two-dimensional network of multiple lossy transmission line segments.

FIG. 5 is a top plan view of a model 30 used to model structure 20 of FIG. 3. Model 30 is a two-dimensional network of multiple lossy transmission line segments 32 interconnected to form a 0.5 in. grid pattern. Lossy transmission line segments 32 account for resistive and skin losses in conductors and dielectric losses in dielectric layer 24.

Figure 6:
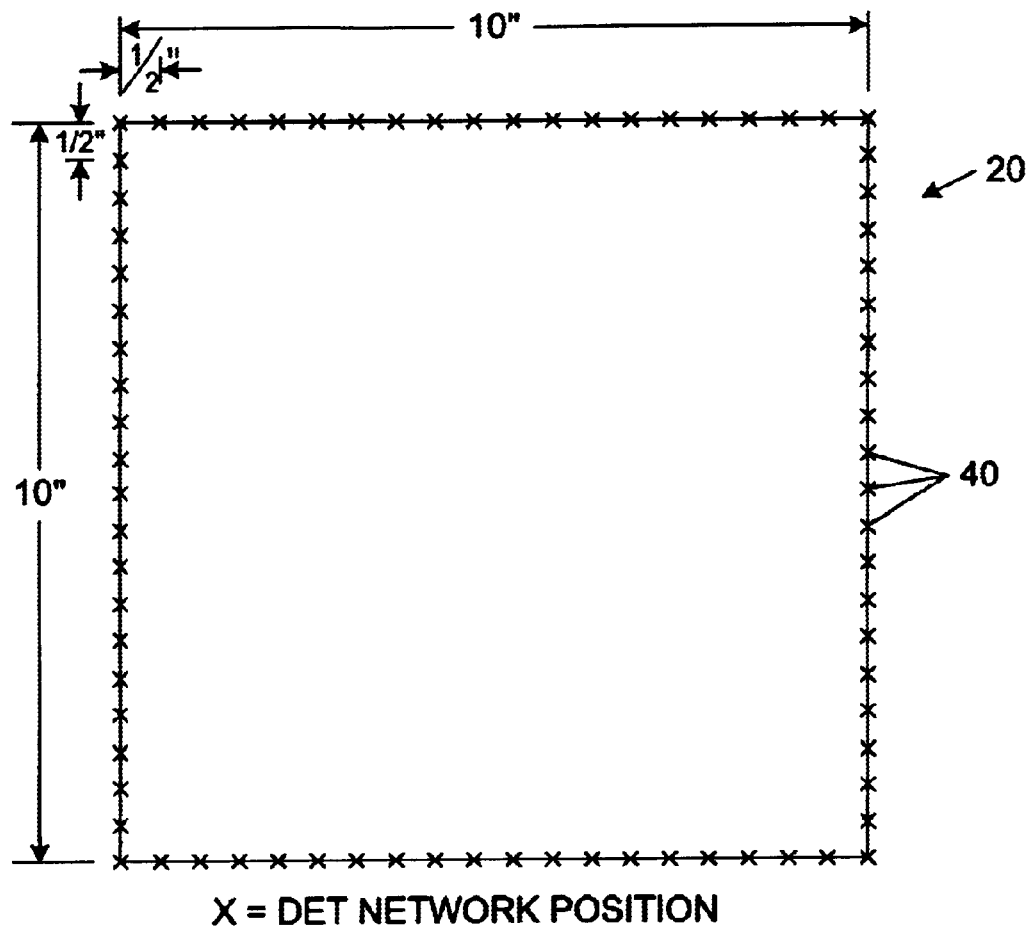
FIG. 6 is a top plan view of the structure of FIG. 3 illustrating the positions of multiple dissipative edge termination (DET) networks used to reduce or completely eliminate electrical resonances in the structure at relatively high frequencies due to open boundaries, wherein the DET networks are coupled between the planes about outer edges of the structure, and wherein each DET network includes a 1 nF capacitor in series with a 1.06 ohm resistor.

FIG. 6 is a top plan view of structure 20 of FIG. 3 illustrating the positions of multiple dissipative edge termination (DET) networks 40 coupled between planes 22 about outer edges of structure 20. Each DET network 40 includes a 1 nF capacitor in series with a 1.06 ohm resistor. Adjacent DET networks 40 are separated by spacing distances of approximately 0.5 in. about outer edges of structure 20. It is noted that DET networks 40 are used only to reduce or completely eliminate electrical resonances in structure 20 at relatively high frequencies due to open boundaries, and are not considered part of a distributed matched bypassing system and method described herein.

Figure 7:
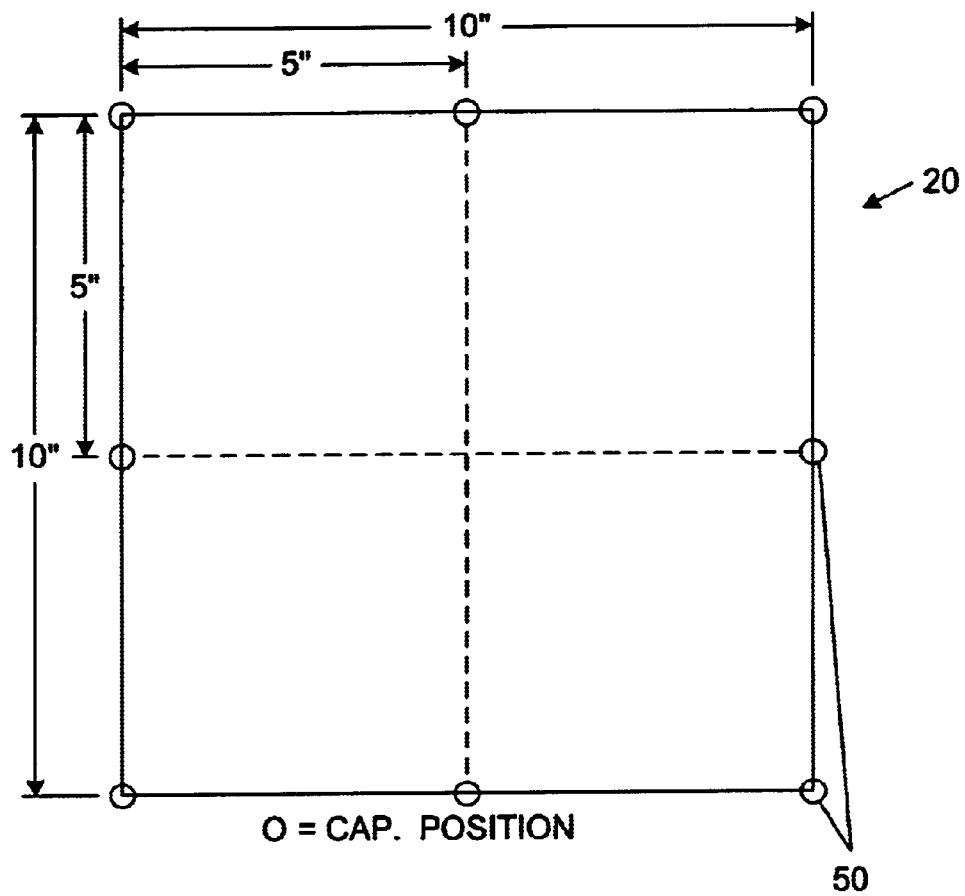
FIG. 7 is a top plan view of the structure of FIG. 3 illustrating the positions of multiple capacitors coupled between the planes about outer edges of the structure as part of a distributed matched bypassing system, wherein all of the capacitors have substantially identical electrical characteristics, and wherein adjacent capacitors are separated by substantially equal spacing distances.

FIG. 7 is a top plan view of structure 20 of FIG. 3 illustrating the positions of multiple capacitors 50 coupled between planes 22 about outer edges of structure 20 as part of a distributed matched bypassing system. All capacitors 50 have substantially the same values of capacitance, ESR, and ESL. Adjacent capacitors 50 are separated by spacing distances of approximately 5.0 in. about outer edges of structure 20 as indicated in FIG. 7.

Figure 8:
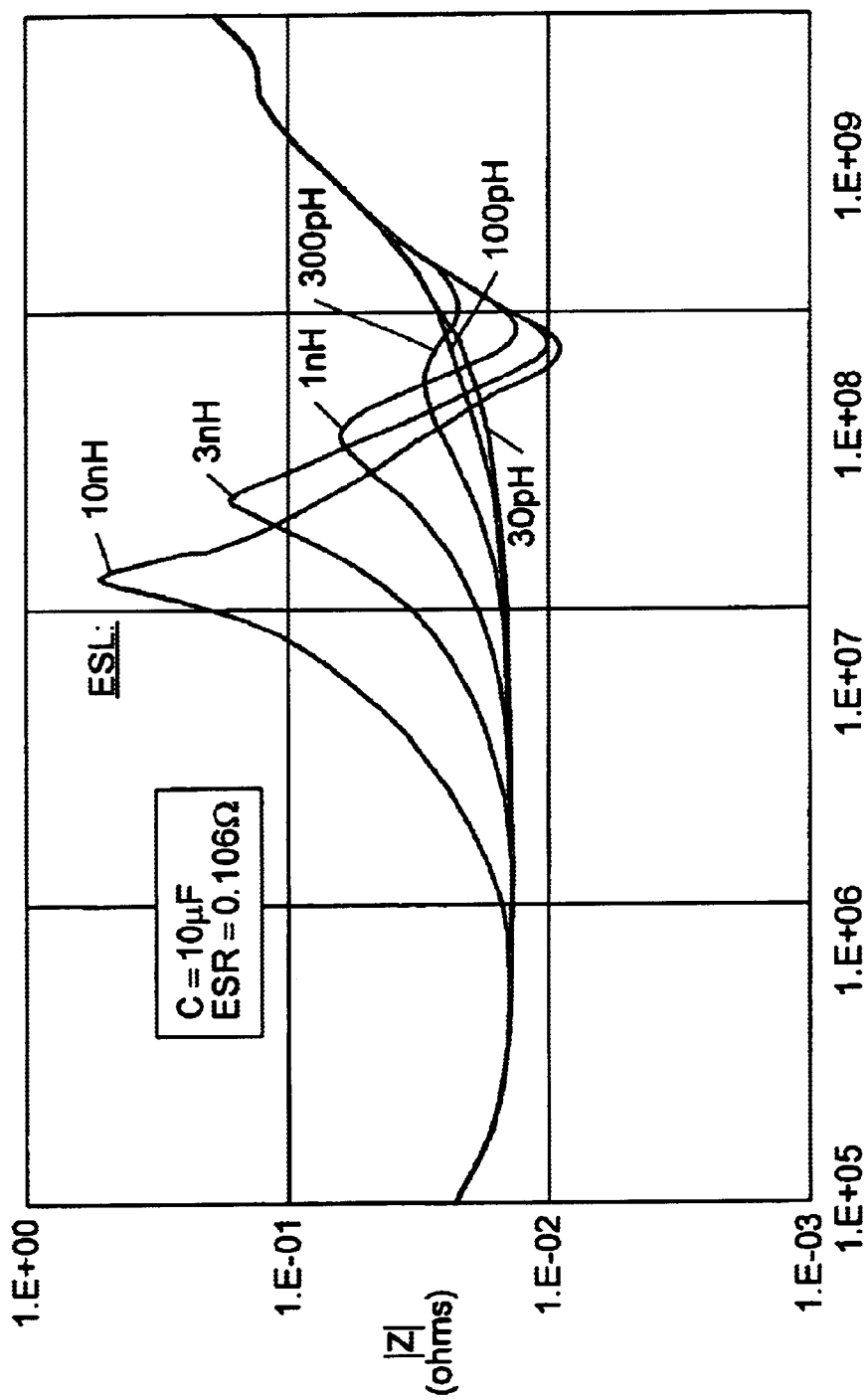
FIG. 8 is a graph of the simulated magnitude of the electrical impedance (Z) of the composite structure of FIGS. 3, 6, and 7 (i.e., the structure of FIG. 3 with the DET networks of FIG. 6 and the capacitors of FIG. 7) versus frequency for several different ESL values of the capacitors of FIG. 7, wherein the capacitors of FIG. 7 have a capacitance C of 10 $\mu$F and an ESR of 0.106 ohms.

FIG. 8 is a graph of the simulated magnitude of the electrical impedance (Z) of the composite structure 20 of FIGS. 3, 6, and 7 (structure 20 of FIG. 3 with DET networks 40 of FIG. 6 and capacitors 50 of FIG. 7) versus frequency for capacitors 50 having several different values of ESL, wherein the capacitance C of all capacitors 50 is 10 $\mu$F, and wherein the ESR values of all capacitors 50 is 0.106 ohms. The impedance values were computed by simulating the application of a 1 ampere constant current between the centers of planes 22, varying the frequency of the current, and determining the magnitude of the steady state voltage between the centers of planes 22.

The graph of FIG. 8 shows that for the 8 capacitors 50 having ESL values of 30 pH and 100 pH, the magnitude of Z is approximately equal to ESR/8 or 0.013 ohms over a relatively wide range of frequencies, and the impedance curves are relatively smooth in comparison to the other impedance curves. On the other hand, the impedance curves for capacitors 50 having ESL values greater than 100 pH show increasing amounts of ripple.

Figure 9:
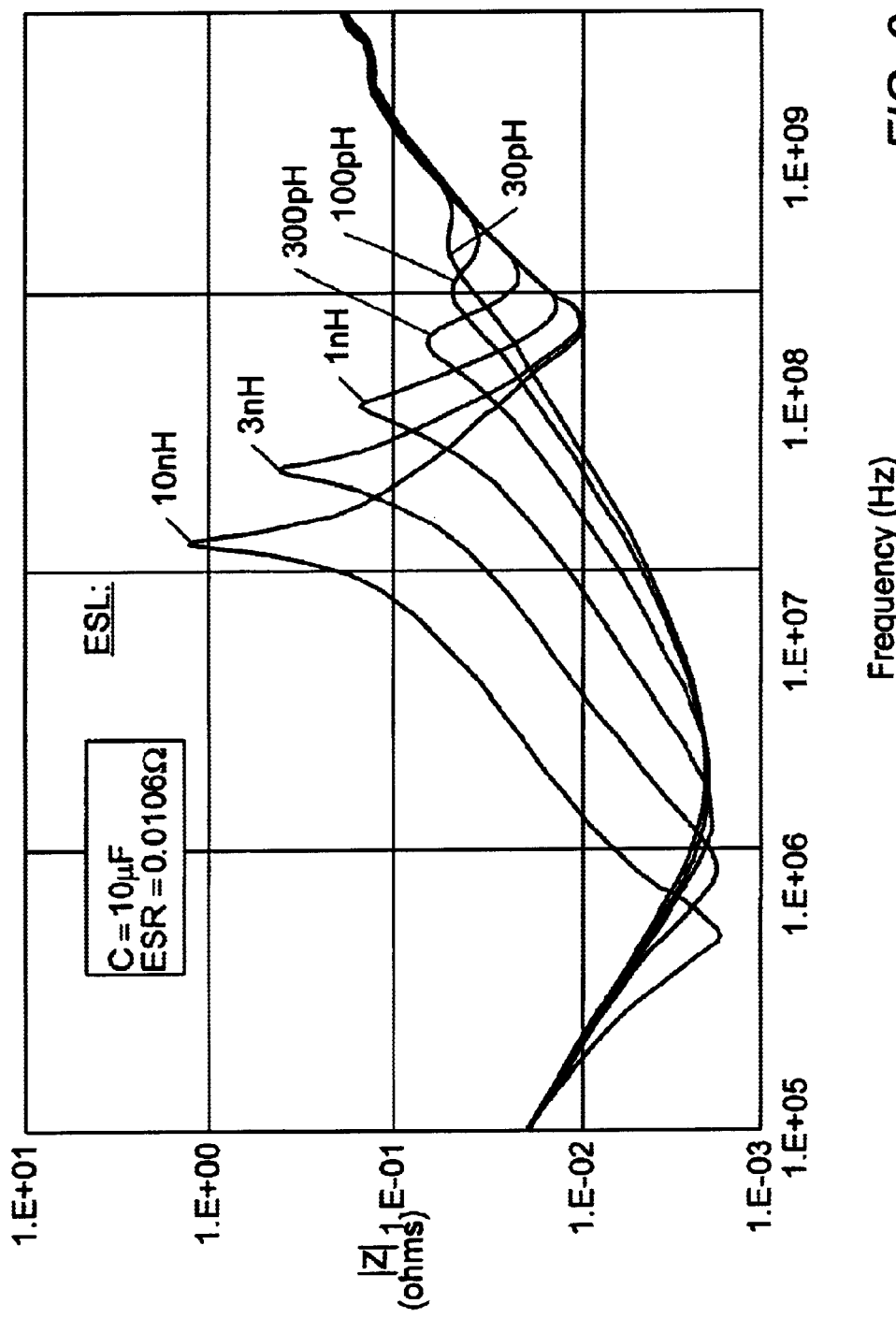
FIG. 9 is a graph of the simulated magnitude of the electrical impedance (Z) of the composite structure of FIGS. 3, 6, and 7 (i.e., the structure of FIG. 3 with the DET networks of FIG. 6 and the capacitors of FIG. 7) versus frequency for several different ESL values of the capacitors of FIG. 7, wherein the capacitors of FIG. 7 have a capacitance C of 10 $\mu$F and an ESR of 0.0106 ohms.

FIG. 9 is a graph of the simulated magnitude of the electrical impedance m) of the composite structure 20 of FIGS. 3, 6, and 7 (structure 20 of FIG. 3 with DET networks 40 of FIG. 6 and capacitors 50 of FIG. 7) versus frequency for capacitors 50 having several different values of ESL, wherein the capacitance C of all capacitors 50 is 10 $\mu$F, and wherein the ESR values of all capacitors 50 is 0.0106 ohms. Again, the impedance values were computed by simulating the application of a 1 ampere constant current between the centers of planes 22, varying the frequency of the current, and determining the magnitude of the steady state voltage between the centers of planes 22.

The graph of FIG. 9 shows that for capacitors 50 with relatively low ESR (i.e., high Q), there is significant ripple in the impedance curve for even the lowest ESL value of 30 pH. The ripple increases the magnitude of Z above about 150 MHz.

Figure 10:
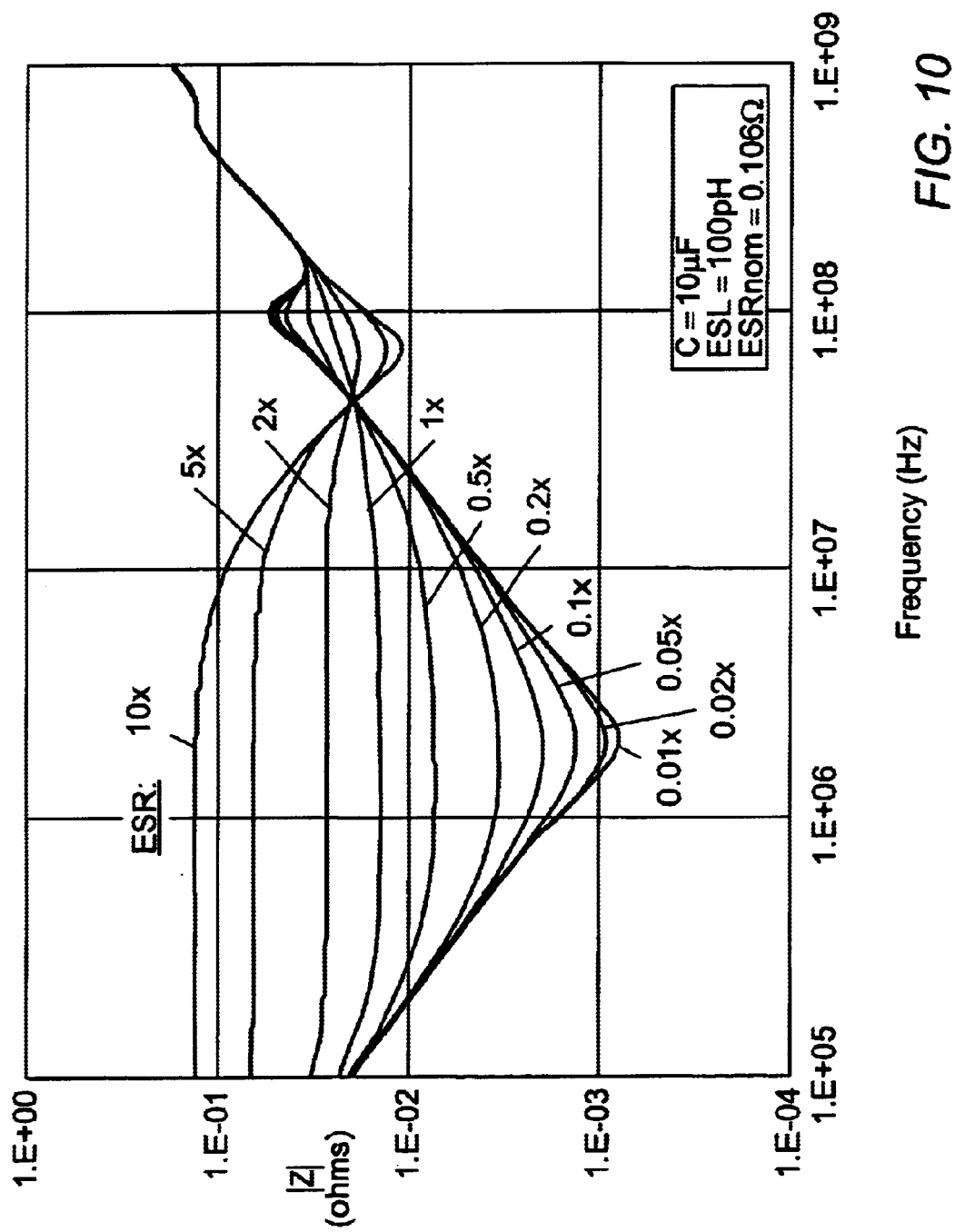
FIG. 10 is a graph of the simulated magnitude of the electrical impedance (Z) of the composite structure of FIGS. 3, 6, and 7 (i.e., the structure of FIG. 3 with the DET networks of FIG. 6 and the capacitors of FIG. 7) versus frequency for several different ESR values of the capacitors of FIG. 7, wherein the capacitors of FIG. 7 have a capacitance C of 10 $\mu$F and an ESL of 100 pH.

FIG. 10 is a graph of the simulated magnitude of the electrical impedance (Z) of the composite structure 20 of FIGS. 3, 6, and 7 (structure 20 of FIG. 3 with DET networks 40 of FIG. 6 and capacitors 50 of FIG. 7) versus frequency for capacitors 50 having several different values of ESR, wherein the capacitance C of all capacitors 50 is 10 $\mu$F, and wherein the ESL of all capacitors 50 is 100 pH. For example, in FIG. 10, the 1× impedance curve was generated using an ESR value of 1× a nominal ESR value of 0.106 ohms. Again, the impedance values were computed by simulating the application of a 1 ampere constant current between the centers of planes 22, varying the frequency of the current, and determining the magnitude of the steady state voltage between the centers of planes 22.

The graph of FIG. 10 shows that for capacitors 50 with ESR values below the 1× (0.106 ohm) optimum, the magnitude of Z decreases with increasing frequency and reaches a minimum at series resonant frequencies around 2 MHz. In addition, a peak develops at about 100 MH at a higher than optimum magnitude of Z. The optimum, the smoothest impedance curve, is achieved when the parallel resultant of the ESR values of all 8 capacitors 50 (ESR/8) equals the characteristic impedance of structure 20.

Manufacturers typically report values of capacitor ESR and ESL measured in isolation. On the other hand, in generating the graphs of FIGS. 8–10 via simulation, each capacitor 50 coupled between parallel planar conductors 22 was assumed to have an equivalent series resistance ESR and an equivalent series inductance ESL in series with a capacitance. In applying conclusions drawn from the graphs of FIGS. 8–10 to real capacitors electrically coupled between parallel power planes of a PCB, the ESR value used in the simulation represents a mounted resistance $R_m$ of the capacitors including, in addition to the ESR, the electrical resistances of all conductors used to couple the capacitors to the power planes of the PCB. Similarly, the ESL value used in the simulation represents a mounted inductance $L_m$ resulting from the coupling of the capacitor structures between the parallel power planes of the PCB. It is noted that for reasons described below, the mounted inductance $L_m$ of a multiplayer ceramic capacitor may actually be less than the ESL of the capacitor measured in isolation and reported by the manufacturer.

Figure 11:
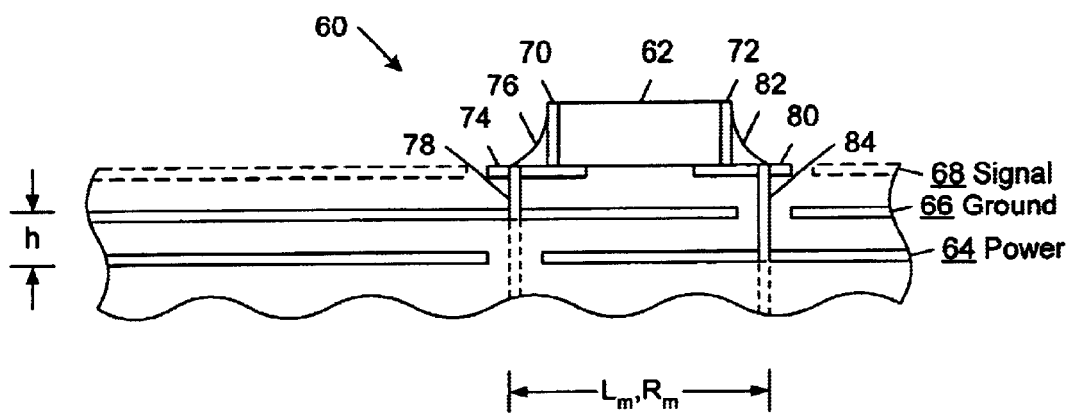
FIG. 11 is a cross sectional view of a portion of one embodiment of an electrical interconnecting apparatus wherein a capacitor (e.g., a multilayer ceramic capacitor) is electrically coupled between a planar power conductor (i.e., a power plane) and a planar ground conductor (i.e., a ground plane), and wherein terminals of the capacitor are coupled to solder lands formed within a signal plane of the interconnecting apparatus, and wherein the signal plane is adjacent to the ground plane, and wherein the solder lands are coupled to the power plane and the ground plane by vias.

FIG. 11 will now be used to describe the mounted resistance $R_m$ and the mounted inductance $L_m$ of an exemplary capacitor coupled between parallel power planes. FIG. 11 is a cross sectional view of a portion of one embodiment of an electrical interconnecting apparatus 60 wherein a capacitor 62 (e.g., a multilayer ceramic capacitor) is electrically coupled between a planar power conductor (i.e., a power plane) 64 and a planar ground conductor (i.e., a ground plane) 66. Capacitor 62 may be, for example, a bypass capacitor. Interconnecting apparatus 60 may be, for example, a PCB, a component of a semiconductor device package, or formed upon a surface of an integrated circuit substrate.

Interconnecting apparatus 60 includes multiple layers of planar electrical conductors separated by dielectric layers. In the embodiment of FIG. 11, capacitor 62 has two terminals 70 and 72 on opposite ends of a body or package. Terminal 70 is electrically connected to a first solder land 74 by a solder fillet 76. Solder land 74 is electrically coupled to ground plane 66 by a via 78. Terminal 72 is electrically connected to a second solder land 80 by a solder fillet 82. Solder land 80 is electrically coupled to power plane 64 by a via 84.

Solder lands 74 and 80 are formed within a signal plane 68. Signal plane 68 includes multiple signal lines (i.e., interconnects or traces) used to convey signals within interconnecting apparatus 60.

During use of interconnecting apparatus 60, power plane 64 is connected to a power terminal of an electrical power supply at a power entry point of interconnecting apparatus 60, and ground plane 66 is connected to a ground terminal of the power supply at the power entry point. Power plane 64 and ground plane 66 provide electrical power to electronic devices connected between power plane 64 and ground plane 66.

Via 78 and solder land 74 electrically couple terminal 70 of capacitor 62 to ground plane 66. Similarly, via 84 and solder land 80 electrically couple terminal 72 of capacitor 62 to power plane 64. Mounted inductance $L_m$ of capacitor 62 is given by:

$$L_m = L_{LAND1} + L_{VIA1} + L_C + L_{VIA2} + L_{LAND2}$$

where $L_{LAND1}$ is the inductance of solder land 74, $L_{VIA1}$ is the inductance of via 78, $L_C$ is the inductance of the combination of signal plane 68 and ground plane 66 between via 78 and via 84 due to a length of the capacitor 62 package, $L_{VIA2}$ is the inductance of via 84, and $L_{LAND2}$ is the inductance of solder land 80.

Mounted resistance $R_m$ of capacitor 62 is given by:

$$R_m = ESR + R_{LAND1} + R_{VIA1} + R_C + R_{VIA2} + R_{LAND2}$$

where ESR is the equivalent series resistance of capacitor 62, $R_{LAND1}$ is the resistance of solder land 74, $R_{VIA1}$ is the resistance of via 78, $R_C$ is the resistance power plane 64 between via 78 and via 84 due to the length of the capacitor 62 package, $R_{VIA2}$ is the resistance of via 84, and $R_{LAND2}$ is the resistance of solder land 80.

Figure 12:
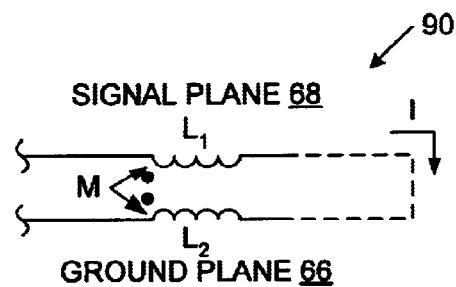
FIG. 12 is an electrical model used to estimate an electrical inductance $L_C$ of the capacitor of FIG. 11, wherein the electrical inductance $L_C$ is the inductance between the signal plane and the ground plane between the vias due to a length of the capacitor body or package.

FIG. 12 is an electrical model 90 used to estimate electrical inductance $L_C$, the inductance of the combination of signal plane 68 and ground plane 66 between via 78 and via 84 due to a length of the capacitor 62 package.

In FIG. 12, $L_1$ represents the self inductance of signal plane 68 between via 78 and via 84, and $L_2$ represents the self inductance of ground plane 66 between via 78 and via 84. Signal plane 68 and ground plane 66, in close proximity to one another, are magnetically coupled to one another, producing a mutual inductance M, where M is given by:

$$M = k\sqrt{L_1 L_2}$$

and k is the coefficient of magnetic coupling between signal plane 68 and ground plane 66.

As indicated in FIG. 12, a current I flows through signal plane 68 and ground plane 66 in opposite directions. Summing the electrical inductances in model 90 around the current loop first along signal plane 68 and then along ground plane 66:

$$L_C = L_1 - M + L_2 - M, \text{ or}$$

$$L_C = L_1 + L_2 - 2M.$$

Assuming $L_1 = L_2 = L$ and using the formula for M given above:

$$L_C = 2L(1-k)$$

where k is the coefficient of magnetic coupling between signal plane 68 and ground plane 66.

It is noted that obtainable values of $L_C$ range from 0.3 to 0.6 nH for multilayer ceramic (MLC) capacitors with relatively small dimensions, and from 0.5 to 2.0 µH for larger MLC capacitors. A portion of these ranges may be lower than ESL values for capacitors measured in isolation and reported by manufacturers.

Figure 13:
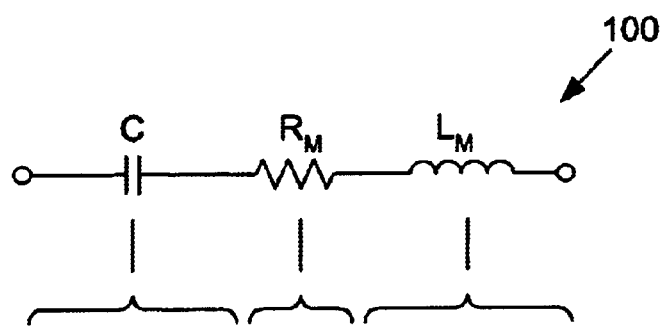
FIG. 13 is a diagram of an electrical model of a bypass capacitor coupled between parallel power planes, wherein the electrical model includes an ideal capacitor, an ideal resistor, and an ideal inductor in series between two terminals of the bypass capacitor, and wherein the ideal capacitor has a value C equal to a capacitance of the bypass capacitor, and wherein the ideal resistor has a value equal to a mounted resistance $R_m$ of the bypass capacitor, and wherein the ideal inductor has a value equal to a mounted inductance $L_m$ of the bypass capacitor.

FIG. 13 is a diagram of an electrical model 100 of a bypass capacitor coupled between parallel power planes. Electrical model 100 is valid over a range of frequencies including a resonant frequency $f_{res}$ of the bypass capacitor. The electrical model includes an ideal capacitor, an ideal resistor, and an ideal inductor in series between two terminals of the bypass capacitor. The ideal capacitor has a value C equal to a capacitance of the bypass capacitor. The ideal resistor has a value equal to a mounted resistance $R_m$ of the bypass capacitor. The mounted resistance $R_m$ of the bypass capacitor is the sum of the ESR of the bypass capacitor and the electrical resistances of all conductors coupling the bypass capacitor to the parallel power planes. The ideal inductor of the electrical model has a value equal to a mounted inductance $L_m$ of the bypass capacitor. The mounted inductance $L_m$ of the bypass capacitor is the electrical inductance resulting from the coupling of the bypass capacitor between the parallel power planes of the PCB. The series combination of the capacitance C and the mounted inductance $L_m$ of the bypass capacitor results in series resonance and a mounted resonant frequency $f_{m-res}$ given by:

$$f_{m-res} = \frac{1}{2\pi \sqrt{(L_m)(C)}}.$$

Figure 14:
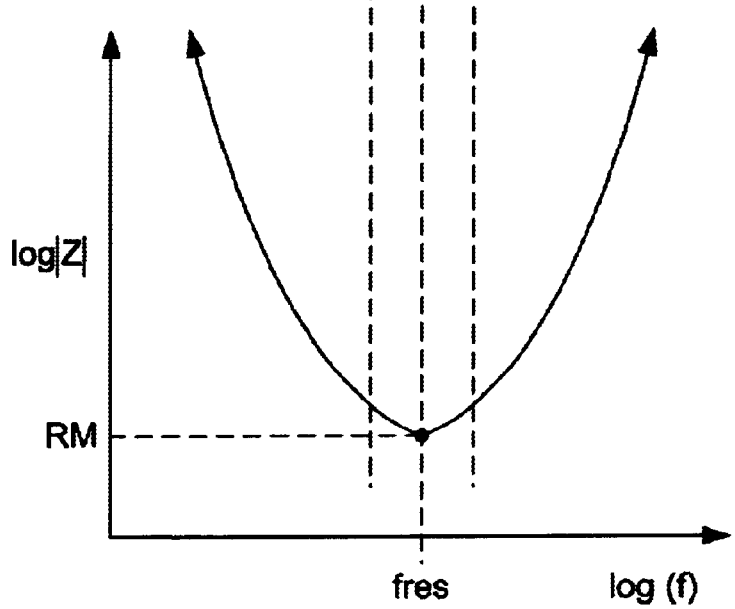
FIG. 14 is a graph of the logarithm of the magnitude of the electrical impedance (z) between the terminals of the electrical model of FIG. 13 versus the logarithm of frequency $f$.

FIG. 14 is a graph of the logarithm of the magnitude of the electrical impedance (Z) between the terminals of electrical model 100 versus the logarithm of frequency $f$. At frequencies $f$ lower than mounted resonant frequency $f$m-res, the impedance of electrical model 100 is dominated by the capacitance, and the magnitude of Z decreases with increasing frequency $f$. At the resonant frequency $f_{m-res}$ of the capacitor, the magnitude of Z is a minimum and equal to the mounted resistance $R_m$ of the capacitor. Within a range of frequencies centered about resonant frequency $f_{m-res}$ the impedance of electrical model 100 is dominated by the mounted resistance $R_m$, and the magnitude of Z is substantially equal to the mounted resistance $R_m$ of the capacitor. At frequencies $f$ greater than resonant frequency $f_{m-res}$, the impedance of electrical model 100 is dominated by the mounted inductance $L_m$, and the magnitude of Z increases with increasing frequency $f$.

Conclusions drawn from FIGS. 8–10 regarding bypass capacitor selection will now be presented in terms of mounted resistance $R_m$ and mounted inductance $L_m$ of multiple bypass capacitors. Bypass capacitor mounted resistance $R_m$ will first be considered. Referring to FIG. 10, the 8 capacitors 50, each having the same series resistance value and coupled between conductive planes 22 of structure 20 (FIG. 7), produced an impedance between conductive planes 22 having a magnitude approximately equal to the series resistance value of capacitors 50 divided by 8. The impedance magnitude was substantially constant over a relatively wide range of frequencies, and the impedance curve was relatively smooth in comparison to the other impedance curves. Thus, to achieve a target impedance $Z_t$ between a pair of parallel planar conductors, a number of bypass capacitors n (n≧2) should be selected having a mounted resistance $R_m$ such that:

$$R_m = n \cdot Z_1.$$

Bypass capacitor mounted inductance $L_m$ will now be considered. The inductance $L_p$ of a pair of conductive planes having target impedance $Z_t$ and separated by a distance or height h is given by:

$$L_p = (\mu_0 \cdot h)$$

where $\mu_0$ is the permeability of free space. It is noted that this equation is still true when the conductive planes are separated by a dielectric layer as dielectric materials used to form dielectric layers are typically non-magnetic, and thus the relative permeability $\mu_r$ of such a dielectric layer is assumed to be unity. FIGS. 8 and 9 can be used to show that smooth impedance curves result when the equivalent inductance of 8 capacitors 50 coupled in parallel between conductive planes 22 ($L_m/8$) is much less than the inductance $L_p$ of conductive planes 22. Additional simulations were used to determine that smooth impedance curves result when the equivalent inductance of the 8 capacitors 50 coupled in parallel between conductive planes 22 ($L_m/8$) is less than or equal to about 20 percent of the inductance $L_p$ of conductive planes 22. Thus, to achieve target impedance $Z_t$ between the pair of parallel planar conductors, the n bypass capacitors should be selected having a mounted inductance $L_m$ such that:

$$L_m \leq (0.2 \cdot n \cdot L_p)$$

The required number of bypass capacitors n will now be considered. The required number of bypass capacitors n may depend upon whether or not the bypass capacitors will be used to suppress plane resonances. A first value for the required number of bypass capacitors $n_1$ may be calculated by: (i) determining the mounted inductance $L_m$ of each of the bypass capacitors, and (ii) substituting the mounted inductance $L_m$ in the following equation:

$$n_1 = \frac{L_m}{(0.2 \cdot L_p)}.$$

If the bypass capacitors are not intended for suppression of plane resonances, the required number of bypass capacitors n is equal to the first value $n_1$. The n bypass capacitors may be dispersed across a surface of one or both of the planar conductors and electrically coupled between the planar conductors.

On the other hand, if the bypass capacitors will be used to suppress plane resonances, at least a portion of the bypass capacitors will be electrically coupled between the planar conductors along an outer edge of the planar conductors. In this case, it is necessary to calculate a second value for the required number of bypass capacitors $n_2$.

In order to suppress plane resonances, adjacent bypass capacitors coupled along an outer edge of the planar conductors should be separated by a spacing distance much less than a wavelength of a highest frequency of interest. For example, the planar conductors may be part of an electrical power distribution structure of an electrical interconnecting apparatus (e.g., a PCB). Electrical signals conveyed within the electrical interconnecting apparatus have an associated frequency range and a maximum frequency $f_{max}$ of the frequency range. The wavelength of maximum frequency $f_{max}$ is the velocity divided by the frequency. If the dielectric layer between the planar conductors has a relative permittivity of $\epsilon_r$, the velocity is the speed of light c (about $3.0 \times 10^8$ m/sec) divided by the square root of $\epsilon_r$. Adjacent bypass capacitors coupled along the outer edge of the planar conductors may be separated by a spacing distance less than or equal to a maximum spacing distance $S_{max}$ may be given by:

$$S_{max} = 0.1 \cdot \left( \frac{c}{f_{max} \cdot \sqrt{\epsilon_r}} \right).$$

The second value for the required number of bypass capacitors $n_2$ is calculated using:

$$n_2 = \frac{d_p}{S_{max}}$$

where $d_p$ is the distance around the outer edges of the planar conductors. If $n_2 \geq n_1$, the required number of bypass capacitors n is equal to $n_2$, and all of the capacitors will be coupled between the planar conductors along the Outer edge of the planar conductors. On the other, if $n_1 > n_2$, the required number of bypass capacitors n is equal to $n_1$, and only $n_2$ of the capacitors will be coupled between the planar conductors along the outer edge of the planar conductors. The remaining ($n_1 - n_2$) capacitors may be dispersed across a surface of one or both of the planar conductors and electrically coupled between the planar conductors.

Figure 15:
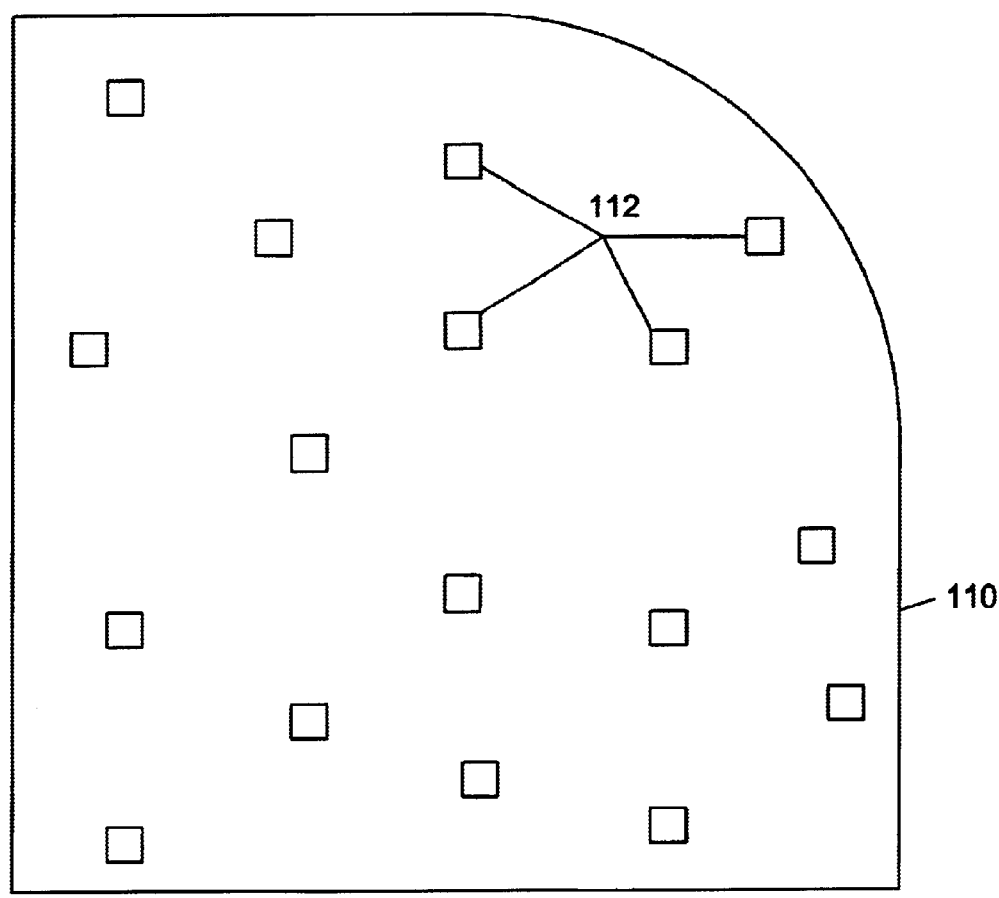
FIG. 15 is a top plan view of an exemplary electrical interconnecting apparatus including a pair of parallel planar conductors, wherein multiple discrete bypass capacitors are located upon, and distributed about, an upper surface of the interconnecting apparatus, and wherein each of the bypass capacitors is coupled between the planar conductors.

FIG. 15 is a top plan view of an exemplary electrical interconnecting apparatus 110 including a pair of parallel planar conductors, wherein multiple discrete bypass capacitors 112 are located upon, and distributed about, a surface of the one of the planar conductors, and wherein each of the bypass capacitors 112 is electrically coupled between the planar conductors. As described above, the arrangement of bypass capacitors 112 in FIG. 15 may be adopted when bypass capacitors 112 are not to be used to suppress resonances of the planar conductors. It is noted that the bypass capacitors 112 may be located upon, and distributed about, surfaces of both of the planar conductors.

Figure 16:
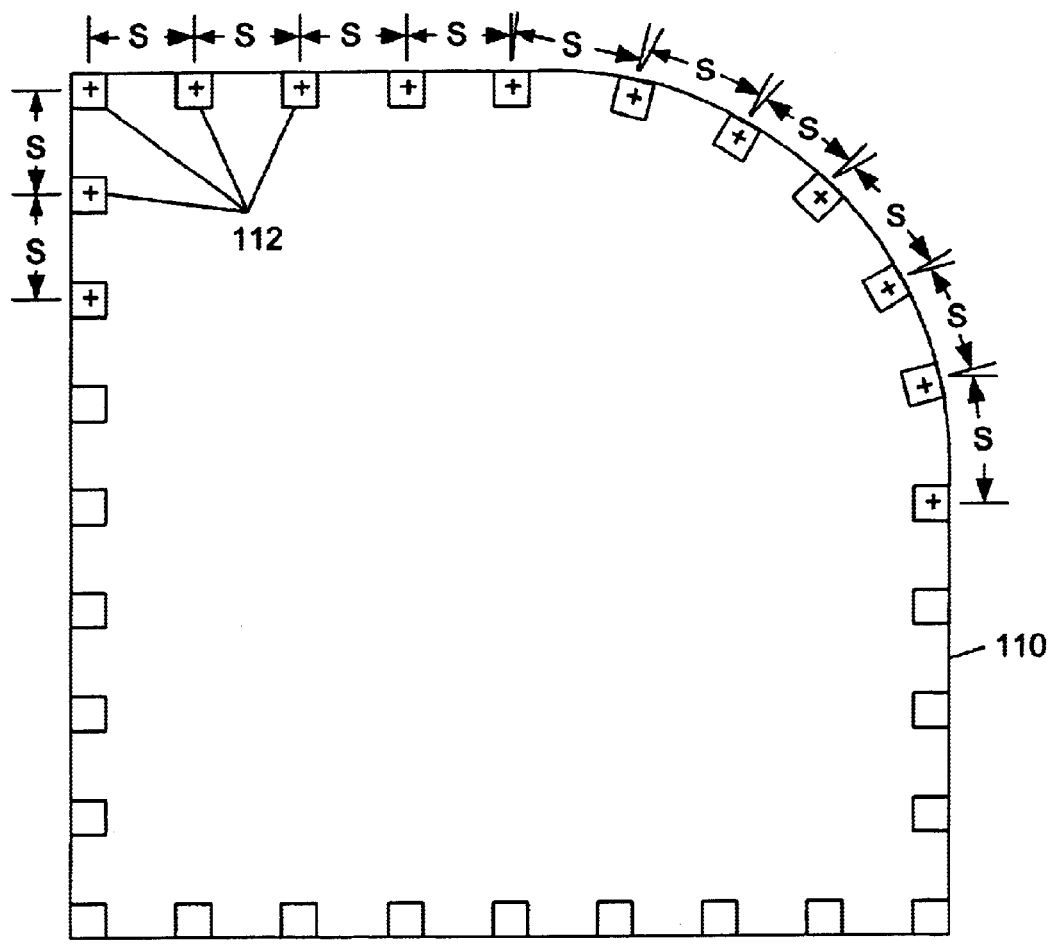
FIG. 16 is a top plan view of the interconnecting apparatus of FIG. 15, wherein the multiple discrete bypass capacitors are electrically coupled between the planar conductors along corresponding outer edges of the planar conductors, and wherein adjacent bypass capacitors are separated by a spacing distance S.

FIG. 16 is a top plan view of the exemplary interconnecting apparatus 110 of FIG. 15, wherein the multiple discrete bypass capacitors 112 are electrically coupled between the planar conductors along corresponding outer edges of the planar conductors. In FIG. 16, adjacent bypass capacitors are separated by a spacing distance S, where $S \leq S_{max}$. As described above, the arrangement of bypass capacitors 112 in FIG. 16 may be adopted when bypass capacitors 112 are to be used to suppress resonances of the planar conductors. It is noted that the bypass capacitors 112 may be positioned along a portion of the corresponding outer edges of the planar conductors.

Calculation of the electrical impedance between a pair of parallel conductive planes separated by a dielectric layer will now be presented. In FIG. 11, interconnecting apparatus 60 includes a planar power conductor (i.e., a power plane) 64 parallel to a planar ground conductor (i.e., a ground plane) 66. Power plane 64 and ground plane 66 are separated by a dielectric layer having a vertical height h. An empirical formula for the electrical impedance Zp between a structure including a pair of parallel conductive planes separated by a dielectric layer (e.g., power plane 64 and ground plane 66 of interconnecting apparatus 60) is:

$$Z_p(\Omega) = \frac{(0.532)(h)}{(\sqrt{\varepsilon_r})(d_p)}$$

where h is the distance (e.g., a height) between the planes in mils (where 1 mil=0.001 inch), $\varepsilon_r$ is the relative permittivity of the dielectric layer, and $d_p$ is the distance around the outer edges (e.g., an outer perimeter) of the structure in inches.

The above formula may also be used to determine the electrical impedance Zp of a structure including multiple pairs of parallel conductive planes separated by dielectric layers. In this case, h is an equivalent distance (e.g., a height) between a representative single pair of planes in mils. In general, for a structure having n pairs of parallel conductive planes separated by dielectric layers:

$$h = \frac{1}{\sum_{i=1}^{n} \frac{1}{h_i}}$$

where $h_i$ is the distance (e.g., height) between the ith pair of the n pairs.

Figure 17:
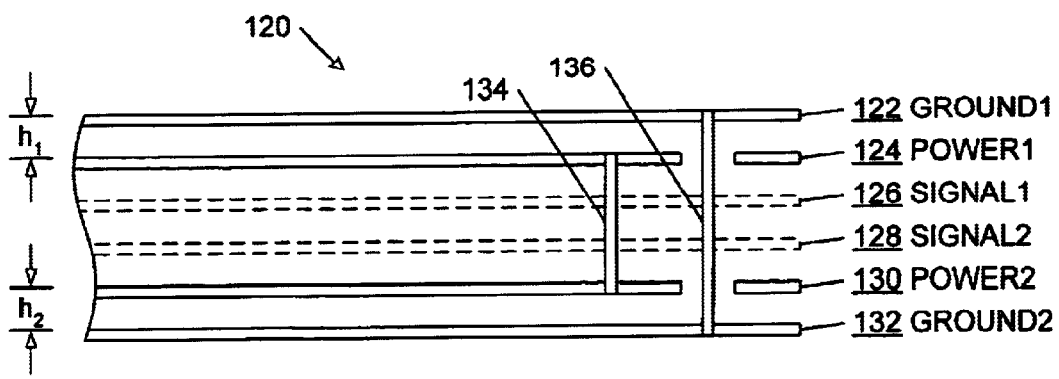
FIG. 17 is a cross sectional view of a portion of one embodiment of an electrical interconnecting apparatus including a power distribution structure having two different pairs of conductive power planes, wherein the interconnecting apparatus includes two signal planes between the pairs of power planes.
Figure 18:
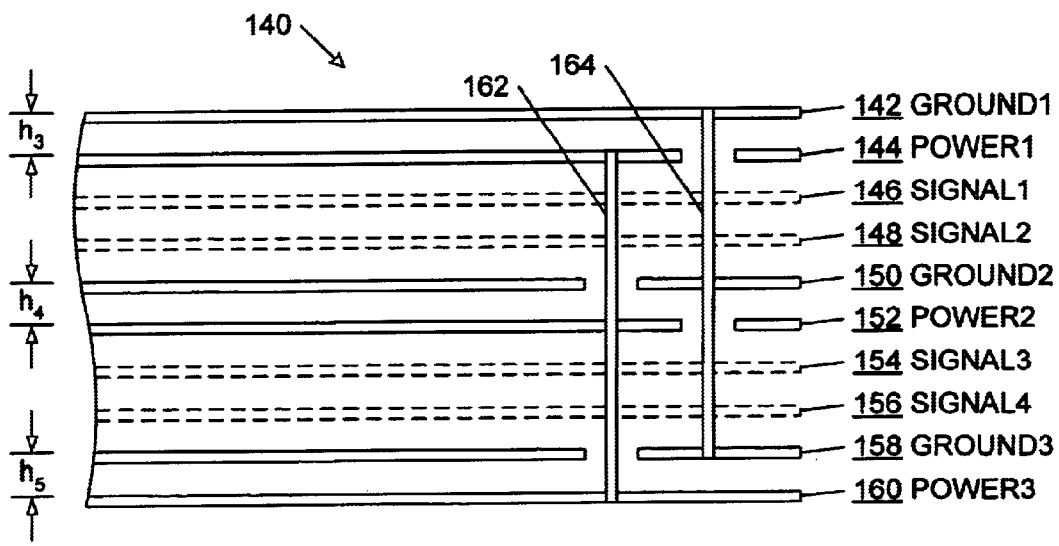
FIG. 18 is a cross sectional view of a portion of one embodiment of an electrical interconnecting apparatus including a power distribution structure having three different pairs of conductive power planes, wherein the interconnecting apparatus includes two signal planes between a first and a second of the three pairs of power planes, and two more signal planes between the second and the third of the three pairs of power planes.

FIGS. 17 and 18 will now be used to illustrate exemplary interconnect apparatus and how an effective distance (e.g., height) h may be calculated for power distribution structures of the interconnect apparatus. FIG. 17 is a cross sectional view of a portion of one embodiment of an electrical interconnecting apparatus 120 including a power distribution structure having two different pairs of conductive power planes. Interconnecting apparatus 120 includes a GROUND1 plane 122 and a POWER1 plane 124 forming one of the pairs of conductive power planes, a SIGNAL1 plane 126, a SIGNAL2 plane 128, and a POWER2 plane 130 and a GROUND2 plane 132 forming the other pair of conductive power planes. POWER1 plane 124 and POWER2 plane 130 are coupled by a via 134, and GROUND1 plane 122 and GROUND2 plane 132 are coupled by a via 136. SIGNAL1 plane 126 and SIGNAL2 plane 128 are used to convey electrical signals within interconnecting apparatus 120.

As shown in FIG. 17, GROUND1 plane 122 and POWER1 plane 124 are separated by a height $h_1$, and POWER2 plane 130 and GROUND2 plane 132 are separated by a height $h_2$. For interconnecting apparatus 120 of FIG. 17, h for use in the above equation for calculating the impedance of the power distribution structure is given by:

$$h = \frac{1}{\frac{1}{h_1} + \frac{1}{h_2}}$$

where $h_1$ and $h_2$ are in mils. It is noted that if $h_1=h_2=h_x$, then $h=h_x/2$.

FIG. 18 is a cross sectional view of a portion of one embodiment of an electrical interconnecting apparatus 140 including a power distribution structure having three different pairs of conductive power planes. Interconnecting apparatus 140 includes a GROUND1 plane 142 and a POWER1 plane 144 forming a first of the three pairs of conductive power planes, a SIGNAL1 plane 146, a SIGNAL2 plane 148, a GROUND2 plane 150 and a POWER2 plane 152 forming a second of three pairs of conductive power planes, a SIGNAL3 plane 154, a SIGNAL4 plane 156, and a GROUND3 plane 158 and a POWER3 plane 160 forming the third pair of conductive power planes. POWER1 plane 144, POWER2 plane 152, and POWER3 plane 160 are coupled by a via 162, and GROUND1 plane 142, GROUND2 plane 150, and GROUND3 plane 158 are coupled by a via 164. SIGNAL1 plane 146, SIGNAL2 plane 148, SIGNAL3 plane 154, and SIGNAL4 plane 156 are used to convey electrical signals within interconnecting apparatus 140.

As shown in FIG. 18, GROUND1 plane 142 and POWER1 plane 144 are separated by a height $h_3$, POWER2 plane 152 and GROUND2 plane 150 are separated by a height $h_4$, and POWER3 plane 160 and GROUND3 plane 158 are separated by a height $h_5$. For interconnecting apparatus 140 of FIG. 18, h for use in the above equation for calculating the impedance of the power distribution structure is given by:

$$h = \frac{1}{\frac{1}{h_3} + \frac{1}{h_4} + \frac{1}{h_5}}$$

where $h_3$, $h_4$, and $h_5$ are in mils. It is noted that if $h_3=h_4=h_5=h_y$, then $h=h_y/3$.

Figure 19A:
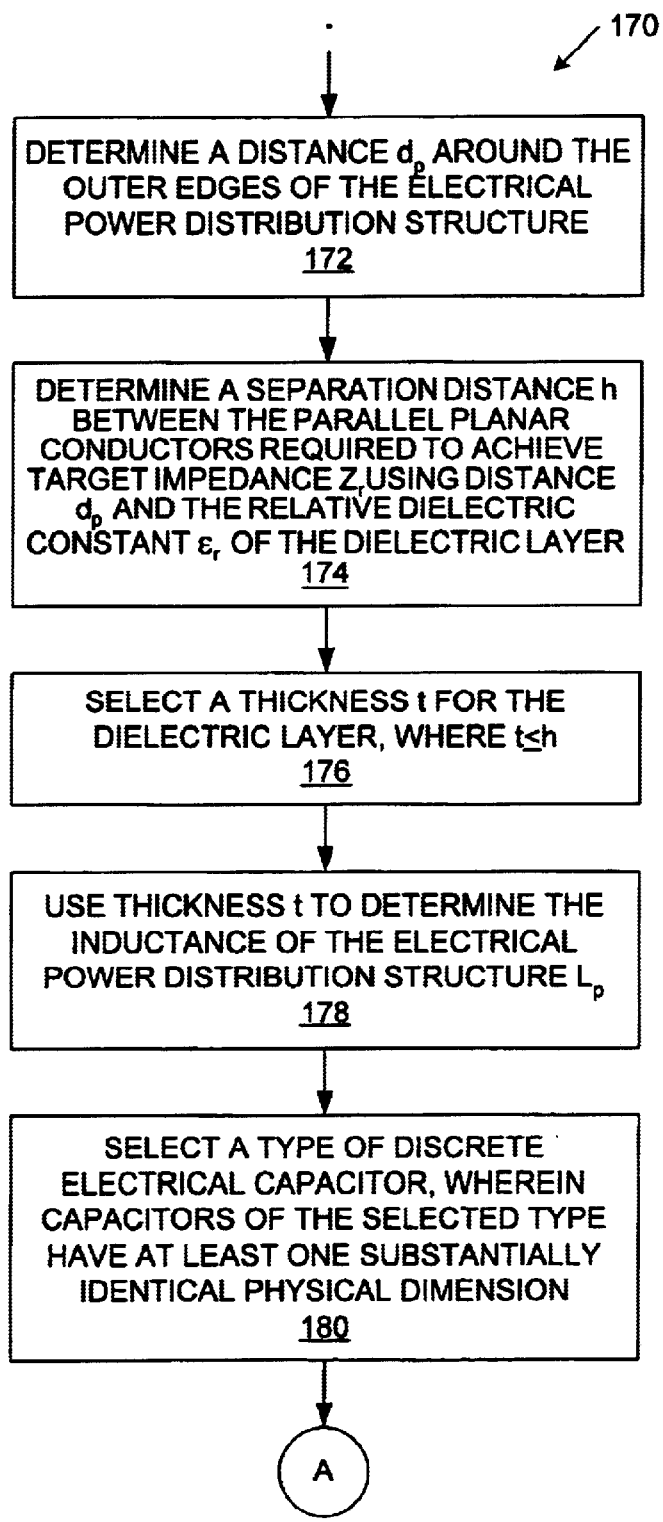
Figure 19B:
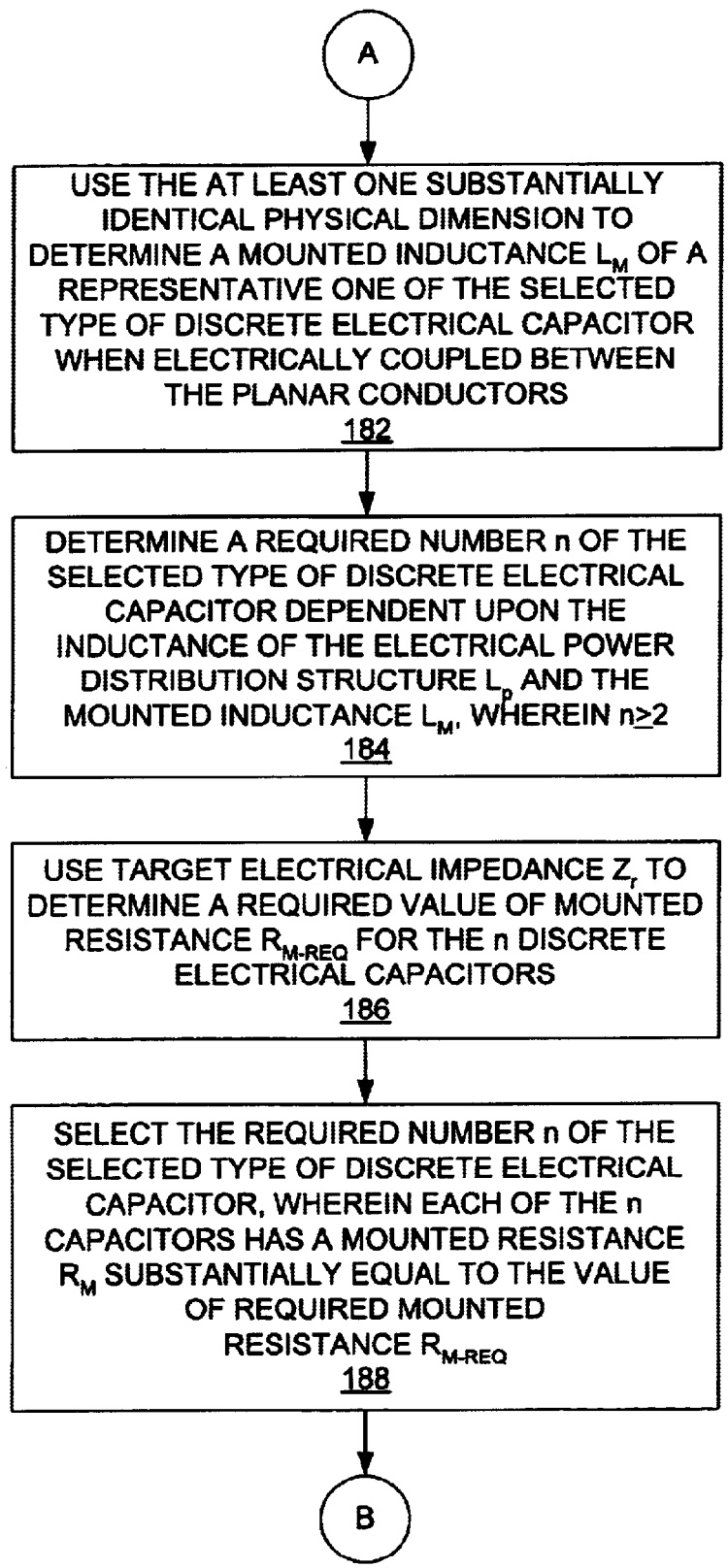
Figure 20B:
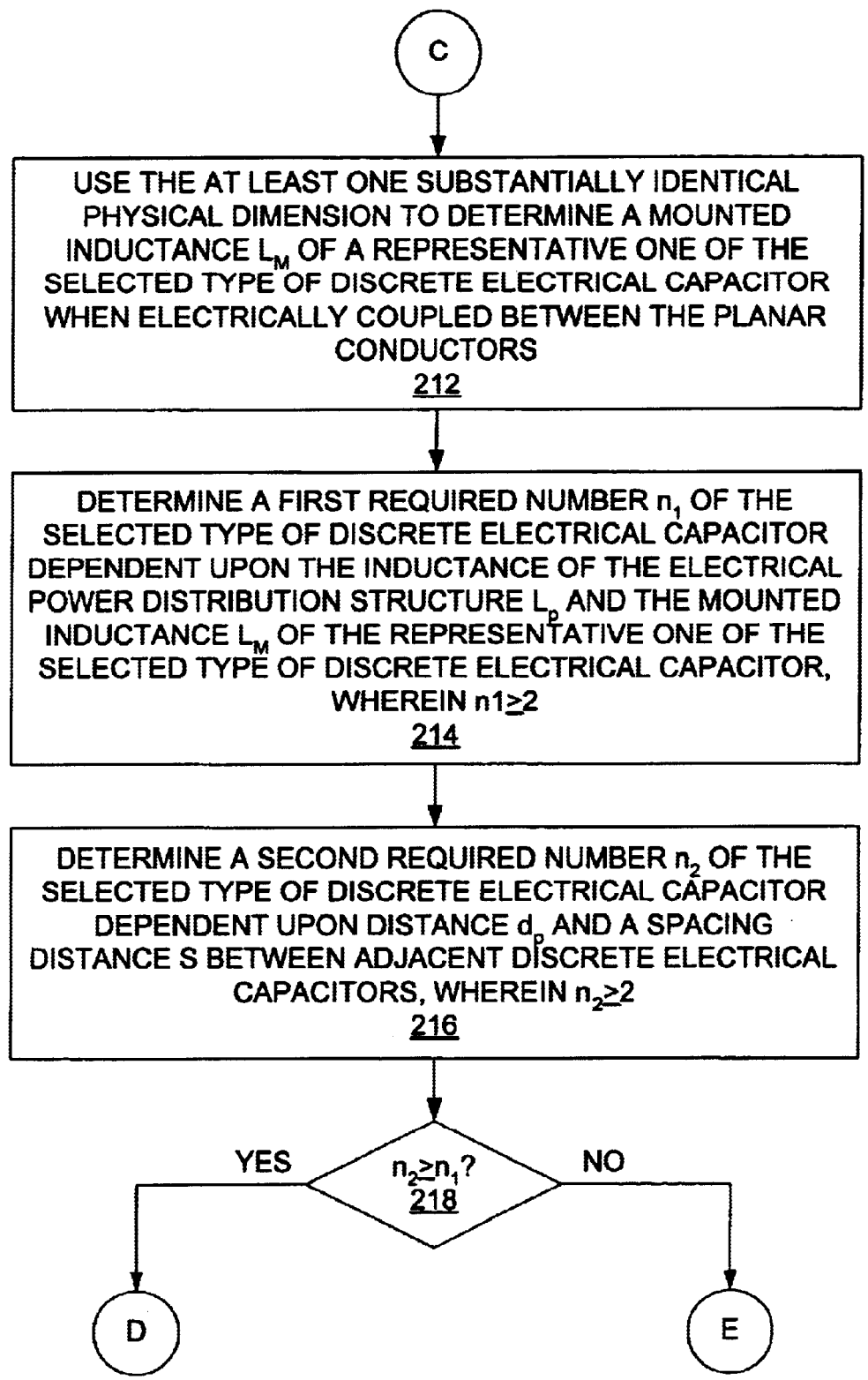
Figure 20C:
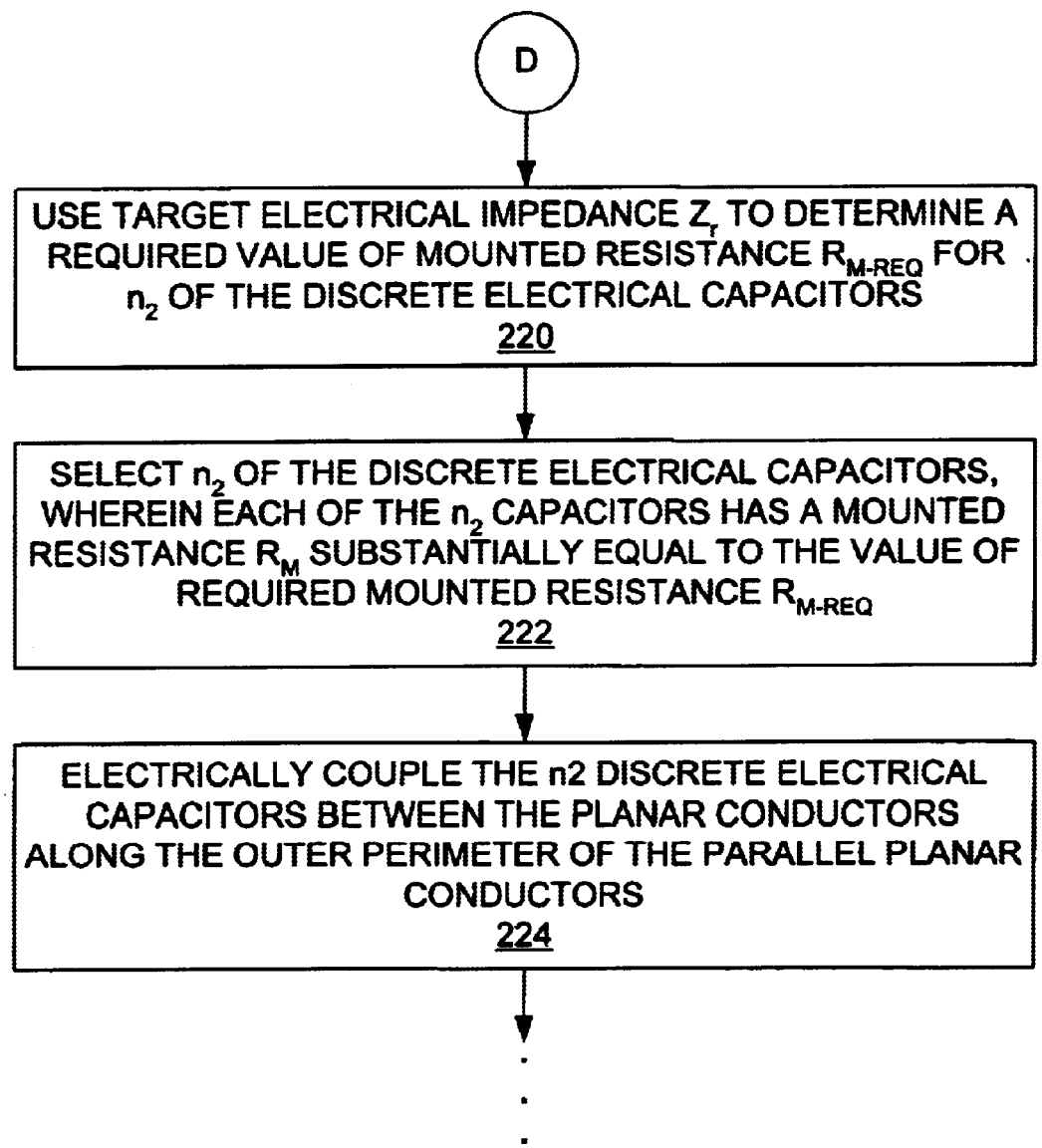
Figure 20D:
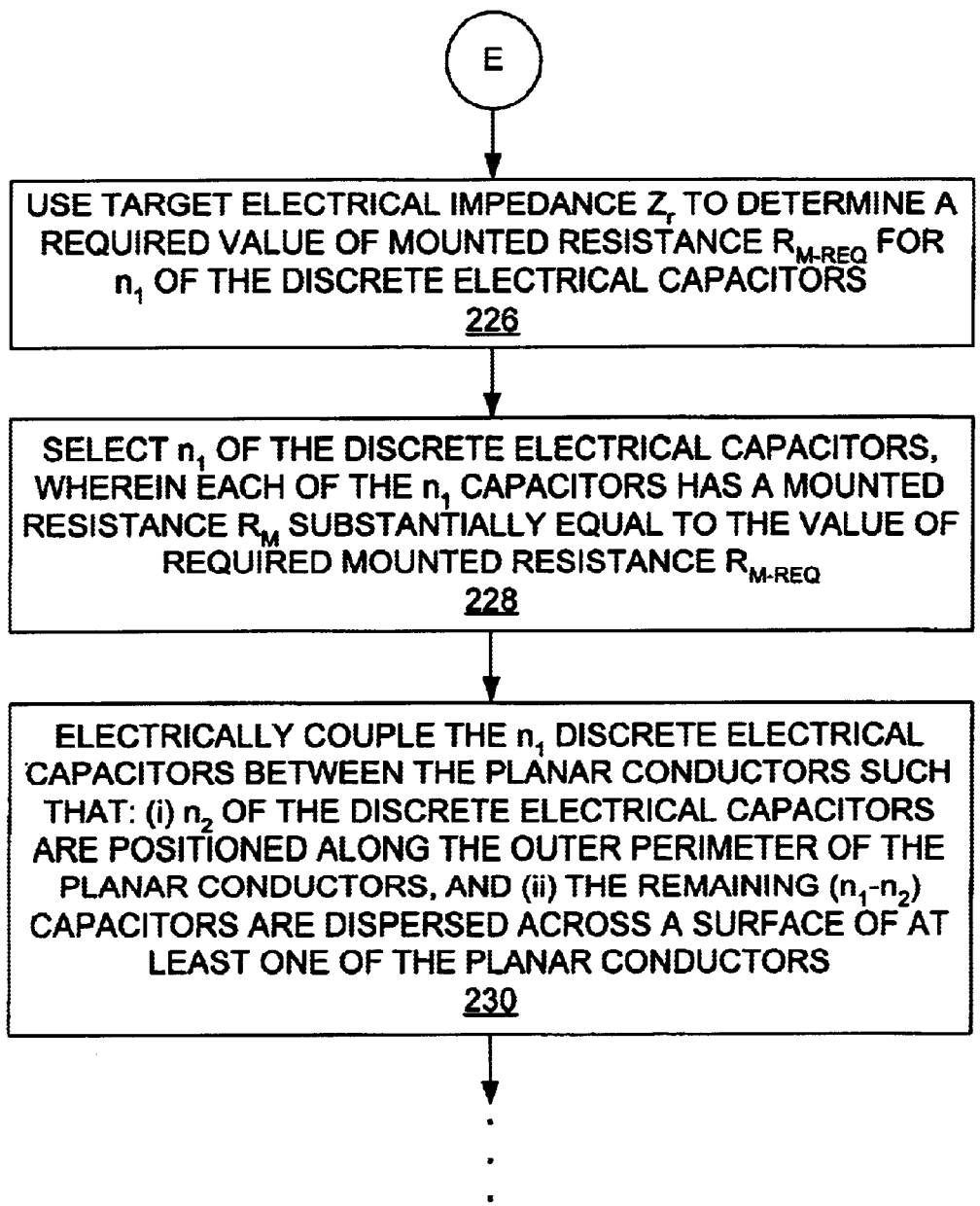

FIGS. 19A, 19B, and 19C in combination form a flow chart of one embodiment of a first method 170 for achieving a target electrical impedance $Z_t$ in an electrical power distribution structure including a pair of parallel planar conductors separated by a dielectric layer. During a step 172, a distance $d_p$ around the outer edges (i.e., the outer perimeter) of the electrical power distribution structure is determined (e.g., measured) as described above. A separation distance h between the parallel planar conductors required to achieve the target electrical impedance $Z_t$ is determined during a step 174 using distance $d_p$ and the relative dielectric constant $\varepsilon_r$ of the dielectric layer. The following equation, based on the above empirical formula for the electrical impedance Zp, may be used to determine separation distance h:

$$h(mils) = \frac{(Z_t)(\sqrt{\varepsilon_r})(d_p)}{(0.523)}$$

where impedance $Z_t$ is in ohms and distance $d_p$ is in inches.

During a step 176, a thickness t is selected for the dielectric layer, where $t \leq h$. Step 176 reflects the fact that thicknesses of dielectric layers between electrically conductive layers (e.g., copper sheets) of commercially available multi-layer printed circuit boards are typically selected from a range of available thicknesses. It is very likely that the above empirical formula for h will yield a required separation distance which lies between two available thickness within the range of available thicknesses. Assume, for example, that the above empirical formula for h yields a required separation distance which lies between a first available thickness and second available thickness, where the first available thickness is greater than the second available thickness. In this case, selected thickness I may be the second available thickness such that t≦h.

During a step 178, the selected dielectric layer thickness t is used to determine the inductance $L_p$ of the electrical power distribution structure. The following equation may be used to calculate inductance $L_p$:

$$L_p = (\mu_0 \cdot t)$$

wherein $\mu_0$ is the permeability of free space. It is noted that the dielectric material used to form the dielectric layer is assumed to be non-magnetic such that the relative permeability $\mu_r$ of the dielectric layer is substantially unity.

A type of discrete electrical capacitor is selected during a step 180, wherein capacitors of the selected type have at least one substantially identical physical dimension (e.g., a length of the capacitor package between terminals, see FIG. 11) upon which a mounted inductance of the capacitors is dependent. During a step 182, the at least one substantially identical physical dimension is used to determine a mounted inductance $L_m$ of a representative one of the selected type of discrete electrical capacitor when the representative capacitor is electrically coupled between the planar conductors. The mounted inductance $L_m$ of the representative discrete electrical capacitor is the electrical inductance resulting from the coupling of the capacitor between the planar conductors.

During a step 184, a required number n of the selected type of discrete electrical capacitor is determined dependent upon the inductance of the electrical power distribution structure $L_p$ and the mounted inductance $L_m$, wherein n≧2. The required number n of the selected type of discrete electrical capacitor may be determined using:

$$n = \frac{L_m}{(0.2 \cdot L_p)}.$$

The target electrical impedance $Z_t$ is used during a step 186 to determine a required value of mounted resistance $R_{m-req}$ for the n discrete electrical capacitors. The required value of mounted resistance $R_{m-req}$ may be determined using:

$$R_{m-req} = n \cdot Z_t.$$

During a step 188, the required number n of the selected type of discrete electrical capacitor are selected, wherein each of the n capacitors has a mounted resistance $R_m$ substantially equal to the value of required mounted resistance $R_{m-req}$. The n discrete electrical capacitors are electrically coupled between the planar conductors during a step 190.

It is noted that during step 176, it is possible that the above empirical formula for h will yield a required separation distance which is less than a minimum available thickness. For example, a minimum thickness of dielectric layers for manufactured printed circuit boards may be 2 mils. If the above empirical formula for h yields a required separation distance which is less than 2 mils, it is possible to add additional pairs of parallel planar conductors to the electrical power distribution structure such that an equivalent thickness t between a representative single pair of parallel planar conductors is achieved. In general, for a structure having n pairs of parallel planar conductors separated by dielectric layers:

$$t = \frac{1}{\sum_{i=1}^{n} \frac{1}{t_i}}$$

where $t_i$ is the thickness of the dielectric layer between the ith pair of the n pairs. The thickness of the dielectric layer between the n pairs of parallel planar conductors may be selected from the range of available thicknesses such that the resulting value of t is less than or equal to h.

FIGS. 20A, 20B, 20C, and 20D in combination form a flow chart of one embodiment of a second method 200 for achieving a target electrical impedance $Z_t$ in an electrical power distribution structure including a pair of parallel planar conductors separated by a dielectric layer. During a step 202, a distance $d_p$ around the outer edges (i.e., the outer perimeter) of the electrical power distribution structure is determined (e.g., measured) as described above. A separation distance h between the parallel planar conductors required to achieve the target electrical impedance $Z_t$ is determined during a step 204 using distance $d_p$ and the relative dielectric constant $\in_r$ of the dielectric layer. The following equation, based on the above empirical formula for electrical impedance Zp, may be used to determine separation distance h:

$$h(mils) = \frac{(Z_t)(\sqrt{\varepsilon_r})(d_p)}{(0.523)}$$

where impedance $Z_t$ is in ohms and distance $d_p$ is in inches.

During a step 206, a thickness t is selected for the dielectric layer, where t≦h. Step 206 reflects the fact that thicknesses of dielectric layers between electrically conductive layers (e.g., copper sheets) of commercially available multi-layer printed circuit boards are typically selected from a range of available thicknesses. As described above, where the empirical formula for h above yields a required separation distance which lies between a first available thickness and second available thickness, and the first available thickness is greater than the second available thickness, selected thickness t may be the second available thickness such that t≦h.

During a step 208, the selected dielectric layer thickness i is used to determine the inductance $L_p$ of the electrical power distribution structure. The following equation may be used to calculate inductance $L_p$:

$$L_p = (\mu_0 \cdot t)$$

wherein $\mu_0$ is the permeability of free space. Again, it is noted that the dielectric material used to form the dielectric layer is assumed to be non-magnetic such that the relative permeability $\mu_r$ of the dielectric layer is substantially unity.

A type of discrete electrical capacitor is selected during a step 210, wherein capacitors of the selected type have at least one substantially identical physical dimension (e.g., a length of the capacitor package between terminals, see FIG. 11) upon which a mounted inductance of the capacitors is dependent. During a step 212, the at least one substantially identical physical dimension is used to determine a mounted inductance $L_m$ of a representative one of the selected type of discrete electrical capacitors when the representative capacitor is electrically coupled between the planar conductors. Again, the mounted inductance $L_m$ of the representative discrete electrical capacitor is the electrical inductance resulting from the coupling of the capacitor between the planar conductors.

During a step 214, a first required number $n_i$ of discrete electrical capacitors is determined dependent upon the inductance of the electrical power distribution structure $L_p$ and the mounted inductance $L_m$ of the selected type of discrete electrical capacitor when electrically coupled between the planar conductors, wherein $n_1 \geq 2$. The first required number $n_1$ may be determined using:

$$n_1 = \frac{L_m}{(0.2 \cdot L_p)}.$$

A second required number $n_2$ of the selected type of discrete electrical capacitor is determined during a step 216 dependent upon distance $d_p$ and a spacing distance $S$ between adjacent discrete electrical capacitors, wherein $n_2 \geq 2$. The second required number $n_2$ may be determined using:

$$n_2 = \frac{d_p}{S}.$$

The electrical power distribution structure may be part of an electrical interconnecting apparatus (e.g., a printed circuit board). In this case, spacing distance $S$ may be less than or equal to a maximum spacing distance $S_{max}$, where $S_{max}$ is a fraction of a wavelength of a maximum frequency $f_{max}$ of a frequency range of electrical signals conveyed within the electrical interconnecting apparatus.

During a decision step 218, the first and second required numbers $n_1$ and $n_2$ are compared. If $n_2 \geq n_1$, steps 220, 222, and 224 are performed. On the other hand, if $n_1 > n_2$, steps 226, 228, and 230 are performed.

During step 220, the target electrical impedance $Z_t$ is used to determine a required value of mounted resistance $R_{m\text{-}req}$ for $n_2$ of the discrete electrical capacitors. The required value of mounted resistance $R_{m\text{-}req}$ for the $n_2$ capacitors may be determined using:

$$R_{m\text{-}req} = n_2 \cdot Z_t.$$

The number $n_2$ of the discrete electrical capacitors are selected during step 222, wherein each of the $n_2$ capacitors has a mounted resistance $R_m$ substantially equal to the value of required mounted resistance $R_{m\text{-}req}$. During step 224, the $n_2$ discrete electrical capacitors are electrically coupled between the planar conductors along the outer perimeter of the parallel planar conductors.

During step 226, the target electrical impedance $Z_t$ is used to determine a required value of mounted resistance $R_{m\text{-}req}$ for $n_1$ of the discrete electrical capacitors dependent upon. The required value of mounted resistance $R_{m\text{-}req}$ for the $n_1$ capacitors may be determined using:

$$R_{m\text{-}req} = n_1 \cdot Z_t.$$

The number $n_1$ of the discrete electrical capacitors are selected during step 228, wherein each of the $n_1$ capacitors has a mounted resistance $R_m$ substantially equal to the value of required mounted resistance $R_{m\text{-}req}$. During step 230, the $n_1$ discrete electrical capacitors are electrically coupled between the planar conductors such that: (i) $n_2$ of the discrete electrical capacitors are positioned along the outer perimeter of the planar conductors, and (ii) the remaining ($n_1 - n_2$) capacitors are dispersed across a surface of at least one of the planar conductors.

It is noted that during step 206, it is possible that the above empirical formula for h will yield a required separation distance which is less than a minimum available thickness. For example, a minimum thickness of dielectric layers for manufactured printed circuit boards may be 2 mils. If the above empirical formula for h yields a required separation distance which is less than 2 mils, it is possible to add additional pairs of parallel planar conductors to the electrical power distribution structure such that an equivalent thickness t between a representative single pair of parallel planar conductors is achieved. In general, for a structure having n pairs of parallel planar conductors separated by dielectric layers:

$$t = \frac{1}{\sum_{i=1}^{n} \frac{1}{t_i}}$$

where $t_i$ is the thickness of the dielectric layer between the ith pair of the n pairs. The thickness of the dielectric layer between the n pairs of parallel planar conductors may be selected from the range of available thicknesses such that the resulting value of t is less than or equal to h.

Numerous variations and modifications will become apparent to those skilled in the art once the above disclosure is fully appreciated. It is intended that the following claims be interpreted to embrace all such variations and modifications.

What is claimed is:

1. An electrical power distribution structure, comprising:

a pair of parallel planar conductors separated by a dielectric layer;

n discrete electrical capacitors electrically coupled between the planar conductors, wherein $n \geq 2$;

wherein the n capacitors have substantially the same capacitance C, mounted resistance $R_m$, mounted inductance $L_m$, and mounted resonant frequency $f_{m\text{-}res}$;

wherein the electrical power distribution structure has an electrical impedance Z at the resonant frequency $f_{m\text{-}res}$ of the n capacitors; and wherein the mounted resistance $R_m$ of each of the n capacitors is substantially equal to (n·Z), and wherein the mounted inductance $L_m$ of each of the n capacitors is less than or equal to $(0.2 \cdot n \cdot \mu_0 \cdot h)$, and wherein $\mu_0$ is the permeability of free space, and wherein h is a distance between the planar conductors.

2. The electrical power distribution structure of claim 1, wherein the mounted resistance $R_m$ of each of the n capacitors is the sun of an equivalent series resistance (ESR) of the capacitor and the electrical resistances of all conductors coupling the capacitor between the planar conductors.

3. The electrical power distribution structure of claim 1, wherein mounted inductance $L_m$ of each of the n capacitors is the electrical inductance resulting from the coupling of the capacitor between the planar conductors.

4. The electrical power distribution structure of claim 1, wherein the mounted resonant frequency $f_{m\text{-}res}$ is given by:

$$f_{m-res} = \frac{1}{2\pi\sqrt{(L_m)(C)}}.$$

5. The electrical power distribution structure of claim 1, wherein the n discrete capacitors are located upon, and distributed about, a surface of at least one of the planar conductors.

6. The electrical power distribution structure of claim 1, wherein the planar conductors have corresponding outer edges, and wherein the n discrete capacitors are positioned along at least a portion of the corresponding outer edges of the planar conductors.

7. The electrical power distribution structure of claim 6, wherein adjacent capacitors are separated by substantially equal spacing distances.

8. A method for achieving a target electrical impedance $Z_t$ in an electrical power distribution structure including a pair of parallel planar conductors separated by a dielectric layer, the method comprising:

determining a separation distance h between the parallel planar conductors required to achieve the target electrical impedance $Z_t$;

determining a required number n of a selected type of discrete electrical capacitor dependent upon an inductance of the electrical power distribution structure $L_p$ and a mounted inductance $L_m$ of a representative one of the selected type of discrete electrical capacitor when electrically coupled between the planar conductors, wherein $n \geq 2$, wherein the mounted inductance $L_m$ is less than or equal to the inductance of the electrical power distribution structure $L_p$;

using the target electrical impedance $Z_t$ to determine a required value of mounted resistance $R_{m\text{-}req}$ for the n discrete electrical capacitors;

selecting the required number n of the selected type of discrete electrical capacitor, wherein each of the n capacitors has a mounted resistance $R_m$ substantially equal to the value of required mounted resistance $R_{m\text{-}req}$; and electrically coupling the n discrete electrical capacitors between the planar conductors.

9. The method as recited in claim 8, wherein the mounted inductance $L_m$ of the representative one of the selected type of discrete electrical capacitors is the electrical inductance resulting from the coupling of the capacitor between the planar conductors.

10. The method as recited in claim 8, wherein the determining of the required number n of the selected type of discrete electrical capacitor is carried out using:

$$n = \frac{L_m}{L_p}.$$

11. The method as recited in claim 8, wherein the determining of the required value of mounted resistance $R_{m\text{-}req}$ is carried out using:

$$R_{m\text{-}req} = n \cdot Z_t.$$

12. The method as recited in claim 8, wherein the mounted resistance $R_m$ of each of the n capacitors is the sum of an equivalent series resistance (ESR) of the capacitor and the electrical resistances of all conductors coupling the capacitor between the planar conductors.

13. The method as recited in claim 8, further comprising:

selecting a thickness t for the dielectric layer such that the thickness I is less than or equal to the required separation distance h;

using thickness t to determine the inductance of the electrical power distribution structure $L_p$;

selecting the type of discrete electrical capacitor, wherein capacitors of the selected type have at least one substantially identical physical dimension; and using the at least one substantially identical physical dimension to determine the mounted inductance $L_m$ of the representative one of the selected type of discrete electrical capacitors.

14. The method as recited in claim 13, wherein the determining of the separation distance h is carried out using:

$$h = \frac{(Z_t)(\sqrt{\varepsilon_r})(d_p)}{(0.523)}$$

wherein $\varepsilon_r$ is the relative permittivity of the dielectric layer and $d_p$ is a distance around an outer perimeter of the electrical power distribution structure, and wherein h is in mils when the target electrical impedance $Z_t$ is in ohms and distance $d_p$ is in inches.

15. The method as recited in claim 13, wherein the determining of the inductance of the electrical power distribution structure $L_p$ is carried out using:

$$L_p = (\mu_0 \cdot t)$$

wherein $\mu_0$ is the permeability of free space.

16. A method for achieving a target electrical impedance $Z_t$ in an electrical power distribution structure including a pair of parallel planar conductors separated by a dielectric layer, the method comprising:

determining a first required number $n_1$ of a selected type of discrete electrical capacitor dependent upon an inductance of the electrical power distribution structure $L_p$ and a mounted inductance $L_m$ of a representative one of the selected type of discrete electrical capacitor when electrically coupled between the planar conductors, wherein $n_1 \geq 2$, and wherein the mounted inductance $L_m$ of each of the selected type of discrete electrical capacitor is less than or equal to the inductance of the electrical power distribution structure $L_p$;

determining a second required number $n_2$ of the selected type of discrete electrical capacitor dependent upon a distance $d_p$ around an outer perimeter of the electrical power distribution structure and a spacing distance S between adjacent discrete electrical capacitors, wherein $n_2 \geq 2$;

performing the following if $n_2 \geq n_1$:

using the target electrical impedance $Z_t$ to determine a required value of mounted resistance $R_{m\text{-}req}$ for $n_2$ of the discrete electrical capacitors;

selecting $n_2$ of the discrete electrical capacitors, wherein each of the $n_2$ capacitors has a mounted resistance $R_m$ substantially equal to the value of required mounted resistance $R_{m\text{-}req}$; and electrically coupling the $n_2$ discrete electrical capacitors between the planar conductors along an outer perimeter of the parallel planar conductors.

17. The method as recited in claim 16, wherein the determining of the required value of mounted resistance $R_{m\text{-}req}$ for $n_1$ of the discrete electrical capacitors is carried out using:

$$R_{m\text{-}req} = n_1 \cdot Z_t.$$

18. The method as recited in claim 16; further comprising:

performing the following if $n_1 > n_2$:
using the target electrical impedance $Z_t$ to determine a required value of mounted resistance $R_{m\text{-}req}$ for $n_1$ of the discrete electrical capacitors;
selecting $n_1$ of the discrete electrical capacitors, wherein each of the $n_1$ capacitors has a mounted resistance $R_m$ substantially equal to the value of required mounted resistance $R_{m\text{-}req}$; and
electrically coupling the $n_1$ discrete electrical capacitors between the planar conductors such that: (i) $n_2$ of the discrete electrical capacitors are positioned along the outer perimeter of the planar conductors, and (ii) the remaining ($n_1 - n_2$) capacitors are dispersed across a surface of at least one of the planar conductors.

19. The method as recited in claim 16, further comprising:

determining a separation distance h between the parallel planar conductors required to achieve the target electrical impedance $Z_t$;
selecting a thickness i for the dielectric layer such that the thickness t is less than or equal to the required separation distance h;
using the thickness t to determining the inductance of the electrical power distribution structure $L_p$;
selecting the type of discrete electrical capacitor, wherein capacitors of the selected type have at least one substantially identical physical dimension; and
using the at least one substantially identical physical dimension to determine the mounted inductance $L_m$ of the representative one of the selected type of discrete electrical capacitor.

20. The method as recited in claim 19, wherein the determining of the separation distance h is carried out using:

$$h = \frac{(Z_t)(\sqrt{\varepsilon_r})(d_p)}{(0.523)}$$

wherein $\varepsilon_r$ is the relative permittivity of the dielectric layer, and wherein h is in mils when the target electrical impedance $Z_t$ is in ohms and distance dp is in inches.

21. The method as recited in claim 19, wherein the determining of the inductance of the electrical power distribution structure $L_p$ is carried out using:

$$L_p = (\mu_0 \cdot t)$$

wherein $\mu_0$ is the permeability of fee space.

22. The method as recited in claim 16, wherein the mounted inductance $L_m$ of the representative one of the selected type of discrete electrical capacitors is the electrical inductance resulting from the coupling of the capacitor between the planar conductors.

23. The method as recited in claim 16, wherein the determining of the first required number $n_1$ of discrete electrical capacitors is carried out using:

$$n_1 \frac{L_m}{(0.2 \cdot L_p)}.$$

24. The method as recited in claim 16, wherein the determining of the required value of mounted resistance $R_{m\text{-}req}$ for $n_2$ of the discrete electrical capacitors is carried out using:

$$R_{m\text{-}req} = n_2 \cdot Z_t.$$

25. The method as recited in claim 16, wherein the mounted resistance $R_m$ of a given capacitor is the sum of an equivalent series resistance (ESR) of the capacitor and the electrical resistances of all conductors coupling the capacitor between the planar conductors.

26. The method as recited in claim 16, wherein the determining of the second required number $n_2$ of the discrete electrical capacitors is carried out using:

$$n_2 = \frac{d_p}{S}.$$

27. The method as recited in claim 26, wherein the electrical power distribution structure is part of an electrical interconnecting apparatus, and wherein electrical signals arc conveyed within the electrical interconnecting apparatus, and wherein the electrical signals have an associated frequency range, and wherein a maximum spacing distance $S_{max}$ between adjacent electrical capacitors is a fraction of a wavelength of a maximum frequency $f_{mqx}$ of the frequency range of the electrical signals, and wherein $S \geq S_{mqx}$.

28. The method as recited in claim 27, wherein $S_{mqx}$ is given by:

$$S_{max} = 0.1 \cdot \frac{c}{(\sqrt{\varepsilon_r} \cdot f_{max})}$$

wherein c is the speed of light in a vacuum, $\varepsilon_r$ is the relative permittivity of the dielectric layer, and $f_{max}$ is the maximum frequency of the frequency range of the electrical signals.

29. The method as recited in claim 16, wherein the electrical power distribution structure has four sides arranged as two pairs of opposite sides, and wherein the sides forming one of the pairs of opposite sides have substantially equal lengths x, and wherein the other two opposite sides have substantially equal lengths y, and wherein the distance $d_p$ around the outer perimeter of the electrical power distribution structure is equal to 2 (x+y).

30. A method for achieving a target impedance in an electrical power distribution structure using a plurality of a decoupling capacitors, the method comprising:

determining a first required number $n_1$ of a selected type of decoupling capacitor and a second required number $n_2$ of the selected type of decoupling capacitor, wherein $n_1$ and $n_2$ are $\geq 2$, wherein the plurality of decoupling capacitors includes the selected type of decoupling capacitor, determining if the plurality of decoupling capacitors is to be used to suppress plane resonances in the electrical power distribution system, wherein, if the plurality of decoupling capacitors is not to be used to suppress plane resonances, then:

distributing $n_1$ of the selected type of decoupling capacitor across the electrical power distribution structure, wherein a mounted inductance $L_m$ of the each of the selected type of capacitor is less than or equal to an inductance $L_p$ of the electrical power distribution structure; and if the plurality of decoupling capacitors is to be used to suppress plane resonances, then:
   placing $n_2$ of the selected type of decoupling capacitor around the perimeter of the electrical power distribution structure.

31. The method as recited in claim 30, wherein each of the of the selected type of decoupling capacitor has a capacitance value, a mounted resistance value, and a resonant frequency value.

32. The method as recited in claim 30, wherein the electrical power distribution structure includes a pair of planar conductors, and wherein each of the plurality of the selected type of decoupling capacitor is electrically coupled between the pair of planar conductors.

33. The method as recited in claim 32, wherein the inductance of the electrical power distribution structure is determined by the formula $L_p=(\mu_0 \cdot h)$, wherein $\mu_0$ is the permeability of free space, and wherein h is the distance between the planar conductors.

34. The method as recited in claim 32, wherein each of the planar conductors has a distance d, around an outer perimeter, wherein each of the $n_2$ of the selected type of decoupling capacitor is placed at a distance S from each other, and wherein $n_2$ is the quotient of $d_p$ divided by S.

* * * * *